(12) United States Patent
Marti et al.

(10) Patent No.: US 7,967,645 B2
(45) Date of Patent: Jun. 28, 2011

(54) HIGH SPEED DATA COMMUNICATIONS CONNECTOR CIRCUITS, SYSTEMS, AND METHODS FOR REDUCING CROSSTALK IN COMMUNICATIONS SYSTEMS

(75) Inventors: Franklin C. Marti, Clinton, WA (US); Jeffrey Alan Poulsen, Edmonds, WA (US); Jason Erickson, Bothell, WA (US); Jeffrey P. Seefried, Lake Stevens, WA (US)

(73) Assignee: Leviton Manufacturing Co., Inc., Melville, NY (US)

( * ) Notice: Subject to any disclaimer, the term of this patent is extended or adjusted under 35 U.S.C. 154(b) by 58 days.

(21) Appl. No.: 12/604,207

(22) Filed: Oct. 22, 2009

(65) Prior Publication Data

US 2010/0041274 A1 Feb. 18, 2010

Related U.S. Application Data

(63) Continuation-in-part of application No. 12/234,597, filed on Sep. 19, 2008, now Pat. No. 7,824,231, said application No. 12/604,207 is a continuation-in-part of application No. 12/401,587, filed on Mar. 10, 2009, now Pat. No. 7,736,195.

(60) Provisional application No. 60/973,675, filed on Sep. 19, 2007.

(51) Int. Cl.
*H01R 24/00* (2006.01)
(52) U.S. Cl. ............................................ 439/676
(58) Field of Classification Search ............. 439/607.01, 439/676, 941
See application file for complete search history.

(56) References Cited

U.S. PATENT DOCUMENTS

| | | | |
|---|---|---|---|
| 4,695,115 A * | 9/1987 | Talend | 439/76.1 |
| 5,186,647 A | 2/1993 | Denkmann et al. | |
| 5,299,956 A | 4/1994 | Brownell et al. | |
| 5,513,065 A * | 4/1996 | Caveney et al. | 361/311 |
| 5,791,943 A | 8/1998 | Lo et al. | |
| 5,940,959 A * | 8/1999 | Caveney et al. | 29/620 |
| 6,083,052 A | 7/2000 | Adams et al. | |
| 6,091,025 A * | 7/2000 | Cotter et al. | 174/110 R |
| 6,139,371 A | 10/2000 | Troutman et al. | |
| 6,186,834 B1 | 2/2001 | Arnett et al. | |
| 6,231,397 B1 | 5/2001 | De La Borbolla et al. | |
| 6,379,157 B1 | 4/2002 | Curry et al. | |

(Continued)

FOREIGN PATENT DOCUMENTS

GB 2380334 A 4/2003

(Continued)

OTHER PUBLICATIONS

Korean Intellectual Property Office (ISA), International Search Report Dated Mar. 23, 2009, International Application No. PCTUS2008077138, Filed Sep. 19, 2008.

(Continued)

*Primary Examiner* — James Harvey
(74) *Attorney, Agent, or Firm* — Kathryn M. Milam; Paul F. Rusyn; Graybeal Jackson LLP

(57) ABSTRACT

A communications outlet includes a plurality of electrically conductive paths arranged in pairs and an electrically conductive shield. A plurality of conductive elements connected to a corresponding conductive path and the conductive elements configured, for each pair, to balance a capacitive coupling between the electrically conductive shield and the conductive paths of that pair.

55 Claims, 13 Drawing Sheets

U.S. PATENT DOCUMENTS

| | | | |
|---|---|---|---|
| 6,464,541 B1 | 10/2002 | Hashim et al. | |
| 6,585,540 B2 * | 7/2003 | Gutierrez et al. | 439/620.19 |
| 6,623,307 B2 * | 9/2003 | Korsunsky et al. | 439/676 |
| 6,641,443 B1 | 11/2003 | Itano et al. | |
| 6,786,776 B2 | 9/2004 | Itano et al. | |
| 7,038,554 B2 | 5/2006 | Seefried | |
| 7,153,168 B2 | 12/2006 | Caveney et al. | |
| 7,179,131 B2 | 2/2007 | Caveney et al. | |
| 7,201,618 B2 | 4/2007 | Ellis et al. | |
| 7,204,722 B2 | 4/2007 | Hashim et al. | |
| 7,273,396 B2 * | 9/2007 | Itano et al. | 439/607.55 |
| 7,281,957 B2 | 10/2007 | Caveney | |
| 7,309,261 B2 | 12/2007 | Caveney et al. | |
| 7,357,683 B2 | 4/2008 | Caveney et al. | |
| 7,381,098 B2 | 6/2008 | Hammond, Jr. et al. | |
| 7,384,315 B2 | 6/2008 | Caveney et al. | |
| 7,736,195 B1 * | 6/2010 | Poulsen et al. | 439/676 |
| 7,794,286 B2 * | 9/2010 | AbuGhazaleh et al. | 439/676 |
| 2006/0189215 A1 | 8/2006 | Ellis et al. | |
| 2007/0173120 A1 | 7/2007 | Caveney et al. | |
| 2007/0270042 A1 | 11/2007 | Belopolsky et al. | |
| 2007/0270044 A1 | 11/2007 | Belopolsky et al. | |
| 2008/0045090 A1 | 2/2008 | Caveney | |
| 2009/0098777 A1 | 4/2009 | Abughazaleh et al. | |
| 2009/0104821 A1 * | 4/2009 | Marti et al. | 439/676 |
| 2009/0163084 A1 | 6/2009 | Straka et al. | |
| 2010/0041274 A1 * | 2/2010 | Marti et al. | 439/607.01 |
| 2010/0041278 A1 | 2/2010 | Bopp et al. | |
| 2010/0151707 A1 * | 6/2010 | AbuGhazaleh et al. | 439/76.1 |

FOREIGN PATENT DOCUMENTS

| | | |
|---|---|---|
| JP | 2000113941 | 4/2000 |
| WO | 2005083849 A1 | 9/2005 |
| WO | 2008060272 A1 | 5/2008 |
| WO | 2009039459 A2 | 3/2009 |

OTHER PUBLICATIONS

Korean Intellectual Property Office (ISA), Written Opinion Dated Mar. 23, 2009, International Application No. PCTUS2008077138, Filed Sep, 19, 2008.

U.S. Appl. No. 12/234,597, filed Sep. 19, 2008; Inventors: Marti et al.

U.S. Appl. No. 12/401,587, filed Mar. 10, 2009; Inventors: Poulsen et al.

European Search Report Dated Dec. 7, 2010, for European Patent Application No. 10 18 7962.

* cited by examiner

| OUTLET A | OUTLET B | | | |
|---|---|---|---|---|
| | PAIR 1 | PAIR 2 | PAIR 3 | PAIR 4 |
| PAIR 1 | MED | LOW | LOW | MED |
| PAIR 2 | HIGH | MED | MED | MED |
| PAIR 3 | MED | MED | MED | HIGH |
| PAIR 4 | MED | LOW | LOW | MED |

FIG. 6

| OUTLET A | OUTLET B | | | |
|---|---|---|---|---|
| | PAIR 1 | PAIR 2 | PAIR 3 | PAIR 4 |
| PAIR 1 | MED | HIGH | MED | MED |
| PAIR 2 | LOW | MED | MED | LOW |
| PAIR 3 | LOW | MED | MED | LOW |
| PAIR 4 | MED | MED | HIGH | MED |

FIG. 7

OUTLET POSITIONS

```
 P3  P4        P3  P4
  500A          500B
 P2  P1        P2  P1
```

OUTLET POSITIONS

```
 P3  P4        P3  P4
  500B          500A
 P2  P1        P2  P1
```

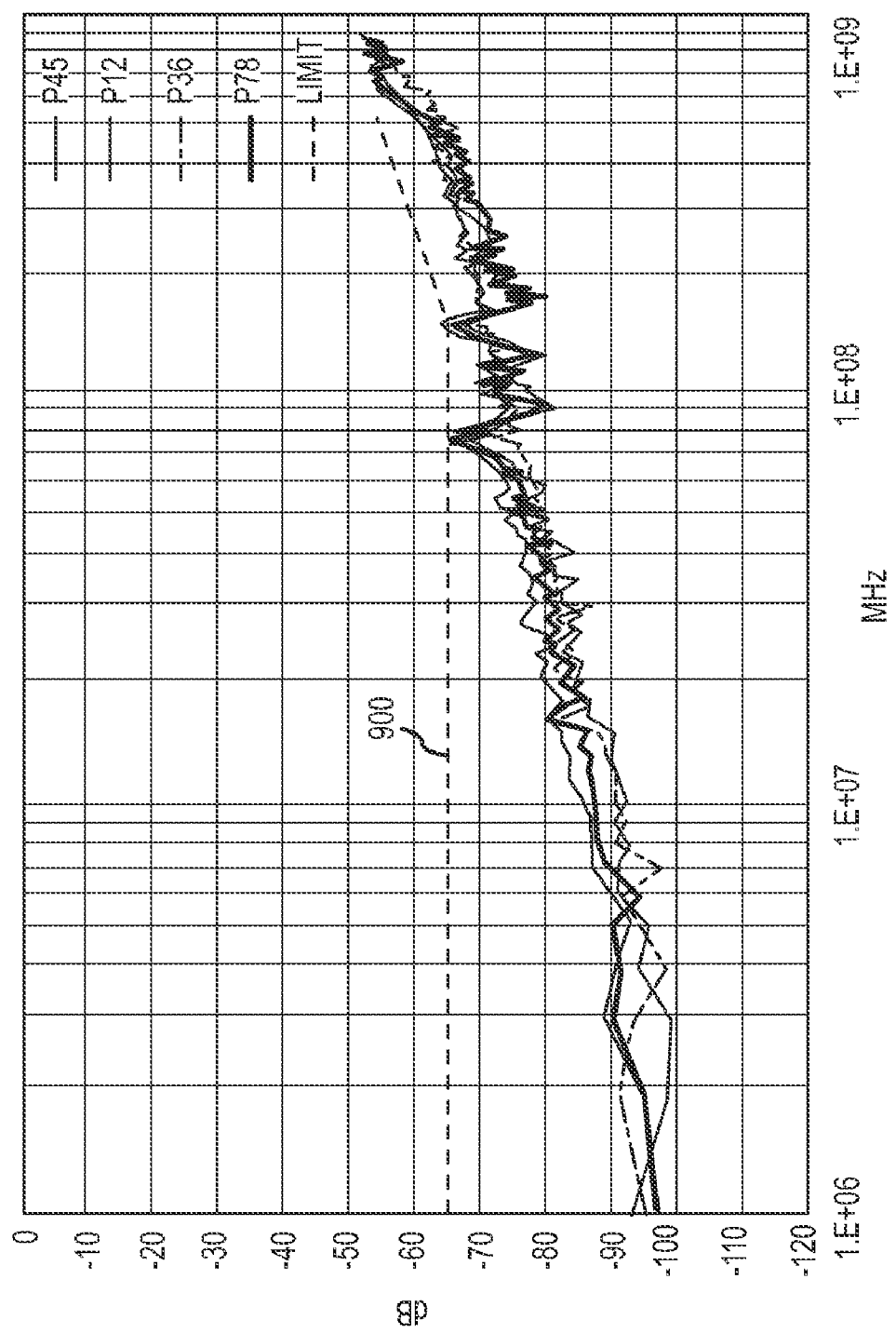

HIGH SPEED DATA COMMUNICATIONS CONNECTOR CIRCUITS, SYSTEMS, AND METHODS FOR REDUCING CROSSTALK IN COMMUNICATIONS SYSTEMS

PRIORITY CLAIM

The present application is a Continuation-in-Part of U.S. patent application Ser. No. 12/234,597, filed Sep. 19, 2008, which claims the benefit of U.S. Provisional Patent Application No. 60/973,675, filed Sep. 19, 2007, now abandoned. The present application is also a Continuation-in-Part of co-pending U.S. patent application Ser. No. 12/401,587, filed Mar. 10, 2009. All of the foregoing applications are incorporated herein by reference in their entireties.

TECHNICAL FIELD

The present invention relates generally to communications systems and, more specifically, to high speed data communications connector circuits, systems, and methods for reducing the level of crosstalk in communications systems in which these circuits and methods are used.

BACKGROUND

The speed of data communications networks has been increasing steadily and substantially over the past several decades, requiring newly designed components to enable the networks to operate at these new higher speeds. As the speed of networks increases, the frequency at which electrical signals are transmitted over communications channels in these networks likewise increases. As a result, electrically conductive paths within the communications channels of the network, which presented no problems at lower frequencies, can become antennae that broadcast and receive electromagnetic radiation and cause errors in the data being communicated. This unwanted coupling of signals from one electrically conductive path to another is known as "crosstalk" and degrades the overall performance of the network. Unwanted crosstalk can occur between any proximate electrically conductive paths that physically form parts of the network, such as individual pairs of physical wires within a given communications cable, between or among nearby communications cables, and within connectors used to connect communications cables to desired electronic components, such as routers and network switches, within the network.

FIG. 1 is a diagram illustrating a portion of a conventional communications network 100 including a typical communications channel 101. The channel 101 includes a communications outlet 102 into which a communications plug 104 of a cable 106 is inserted to thereby connect a first electronic subsystem 108, such as a computer system, to the communications network 100. The communications outlet 102 fits within an opening 110 of a wall plate 112 to expose an aperture 114 in the communications outlet into which the plug 104 is inserted. Electrical signals are then communicated to and from the computer system 108 through the cable 106, plug 104, outlet 102 and a cable 116. The cable 116 includes another communications outlet 118 on the other end of the cable, with the communications outlet 118 often being part of another network component such as a patch panel 120. A second electronic subsystem 122, such as a network switch or other network component, is connected to outlet 118 through a cable 124 and plug 126 to interconnect the communications channel 101 to other components in the network 100 as indicated by the arrow 127.

The cables 106 and 116, plug 104 and 126, and outlets 102 and 118 are standardized components that include specified numbers of electrically conductive paths and a fixed configuration or arrangement of such paths within the plugs and outlets. Where the system 100 utilizes the Ethernet communications standard, for example, data is communicated through one or more twisted-pairs of conductive wires in the cables 106, 116. The plugs 104, 126 and outlets 102, 118 likewise include four corresponding pairs of electrically conductive elements or paths, such as in RJ45 outlets and plugs. For historical reasons, the physical arrangement of such electrically conductive paths within the plugs 104 and 126 is such that unwanted crosstalk is generated between pairs of electrically conductive paths. The outlets 102, 118, are designed in such a manner as to nullify the crosstalk generated by the plugs. As the speed at which data is communicated increases, so does the frequency range of operation for all components of the communications channel 101, making nullification of the unwanted crosstalk more difficult to achieve for reasons understood by those skilled in the art. This arrangement of electrically conductive paths within the plugs 104, 126 and outlets 102, 118 has nonetheless been retained even for current high-speed networks to provide compatibility between old and new network components.

As the speed or frequency at which networks operate continues to increase, crosstalk can become significant and can interfere with the proper operation of the network 100. There are generally two types of crosstalk. The first type of crosstalk occurs among the pairs of electrically conductive paths within an individual communications channel 101 and is termed "internal crosstalk." Internal crosstalk is the unwanted signals communicated from one pair to another within a single communications channel.

The second type of crosstalk is known as "alien crosstalk" and occurs between or among pairs of electrically conductive paths in different communications channels 101. Alien crosstalk can be defined as unwanted signals communicated between pairs in different channels. Alien crosstalk can occur between most components of communications networks 100, and is particularly significant between those components which are physically located proximate to each other. For example, assume that nearby the cables 106, 116, plugs 104, 126, and outlets 102, 118 of the communications channel 101 of FIG. 1, there are several additional similar communications channels (not shown) having corresponding components. This would typically be the case in the network 100. In this situation, alien crosstalk can occur between the communications channel 101 and the additional physically proximate communications channels.

One particular type of alien crosstalk is known as "modal alien crosstalk" and is initiated by the unequal electrical exposures of some of the electrically conductive paths within the plugs 104, 126 to other comparable electrically conductive paths. These unequal electrical exposures result in a modal conversion of signals that causes unwanted electromagnetic waves of a different mode to propagate on electrically conductive paths in a given communications channel 101. These unwanted electromagnetic waves of a different mode can cause crosstalk in adjacent communications channels 101 that can interfere with the proper operation of such channels, particularly at the ever increasing frequencies at which networks operate. Since the outlets 102, 118 have conductors similarly arranged to those of the plug 104, 126 to be mechanically compatible, both the outlets and the plugs in a given channel cause modal conversion of signals. In addition, compensation circuitry used in the outlet to neutralize internal crosstalk can further add to the modal conversion of signals. Thus, both plugs and outlets contribute to the generation of modal alien crosstalk.

There is a need for improved communications outlets designed to neutralize the modal conversion of signals initiated in the plug, reduce that generated in the outlet itself, and reduce internal crosstalk without significantly increasing the complexity of manufacturing the outlet or its cost.

SUMMARY

According to one aspect of the present invention, a communications outlet includes a plurality of electrically conductive paths arranged in pairs and an electrically conductive shield. A plurality of conductive elements each connected to a corresponding conductive path and the conductive elements configured, for each pair, to balance a capacitive coupling between the electrically conductive shield and the conductive paths of that pair. The electrically conductive shield may be floating, where a floating electrically conductive shield is understood by those skilled in the art to be a conductive shield that is not directly electrically connected to any other circuit or ground connection.

According to another aspect of the present invention, a method of reducing alien crosstalk in a communications outlet having an electrically conductive shield and a plurality of electrically conductive paths arranged in pairs. The method includes, for each pair, connecting a conductive element to at least one of the electrically conductive paths of the pair to balance a capacitive coupling between each of the electrically conductive paths of the pair and the electrically conductive shield.

According to another aspect of the present invention, the floating electrically conductive shield, when used in combination with tines having electrical crossovers as described in U.S. Pat. No. 5,186,647, internal crosstalk cancellation on the rigid printed circuit board as described in U.S. Pat. No. 6,379,157, modal alien crosstalk compensation on the rigid printed circuit board as described in U.S. patent application Ser. No. 12/401,587, and alien near end crosstalk ("ANEXT") cancellation by a snap-on connector isolation shield as described in U.S. Pat. No. 7,273,396, enables an outlet to perform to the desired level in meeting the cabling requirement standards for CAT6A.

BRIEF DESCRIPTION OF THE DRAWINGS

FIG. 6 is a table illustrating the relative levels of power sum alien near end crosstalk (PSANEXT) between the pairs in the first and second communications outlets when the outlets are positioned as shown in FIG. 5.

FIG. 7 is a table illustrating the levels of power sum alien near end crosstalk (PSANEXT) between the pairs in the first and second communications outlets when the position of the outlets is reversed relative to that shown in FIG. 5.

FIG. 9 is a graph illustrating alien crosstalk levels as a function of frequency between pairs in two communications outlets in close proximity to each other that shows unwanted resonant peaks occurring at certain frequencies that cause the alien crosstalk to exceed desired limits.

DETAILED DESCRIPTION

Figure 1:
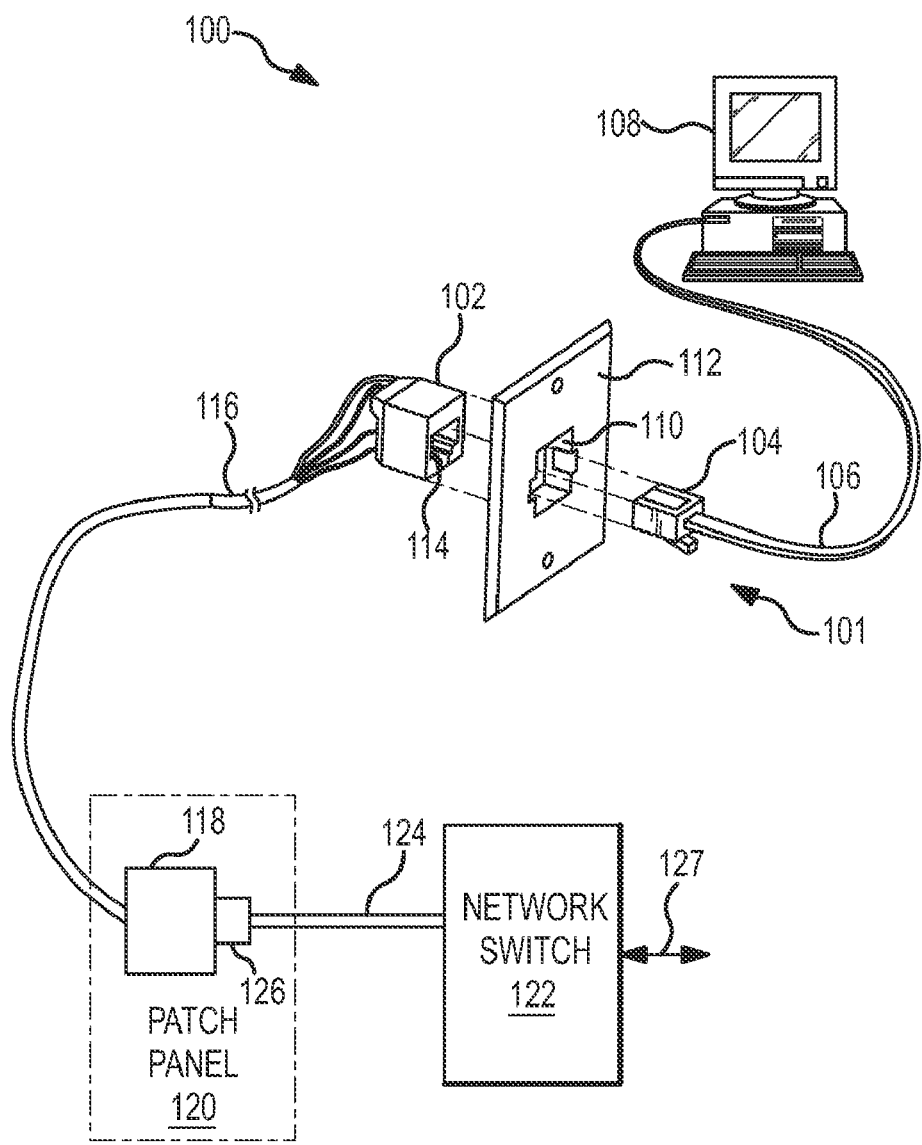
FIG. 1 is a diagram illustrating a portion of a conventional communications network including a communications outlet.

FIGS. 2, 3, 3A, and 3B are perspective views of a communications outlet 200 including a system for high speed data transmission. According to embodiments of the present invention, the outlet 200 is a system comprised of a number of different components including: 1) an internal crosstalk compensation stage 205 including a flexible printed circuit board (PCB) physically and electrically connected to conductive outlet tines, a plurality of resilient, elongated spring members, crossover portions of selected pairs of the conductive outlet tine and a rigid printed circuit board; 2) a modal alien crosstalk compensation stage 207 placed on the flexible printed circuit board and/or the rigid printed circuit board as described in more detail in U.S. patent application Ser. No. 12/401,587; and 3) an alien crosstalk compensation stage 209 including an electrically conductive floating shield portion and associated capacitive compensation portion, some aspects of which are described herein and some aspects of which are described in U.S. Pat. No. 7,273,396 ("396 Patent"). In operation, the crosstalk compensation stages 205, 207 and 209 reduce internal, modal alien, and alien crosstalk levels in communications channels containing the communications outlet 200 as described in more detail below.

Figure 2:
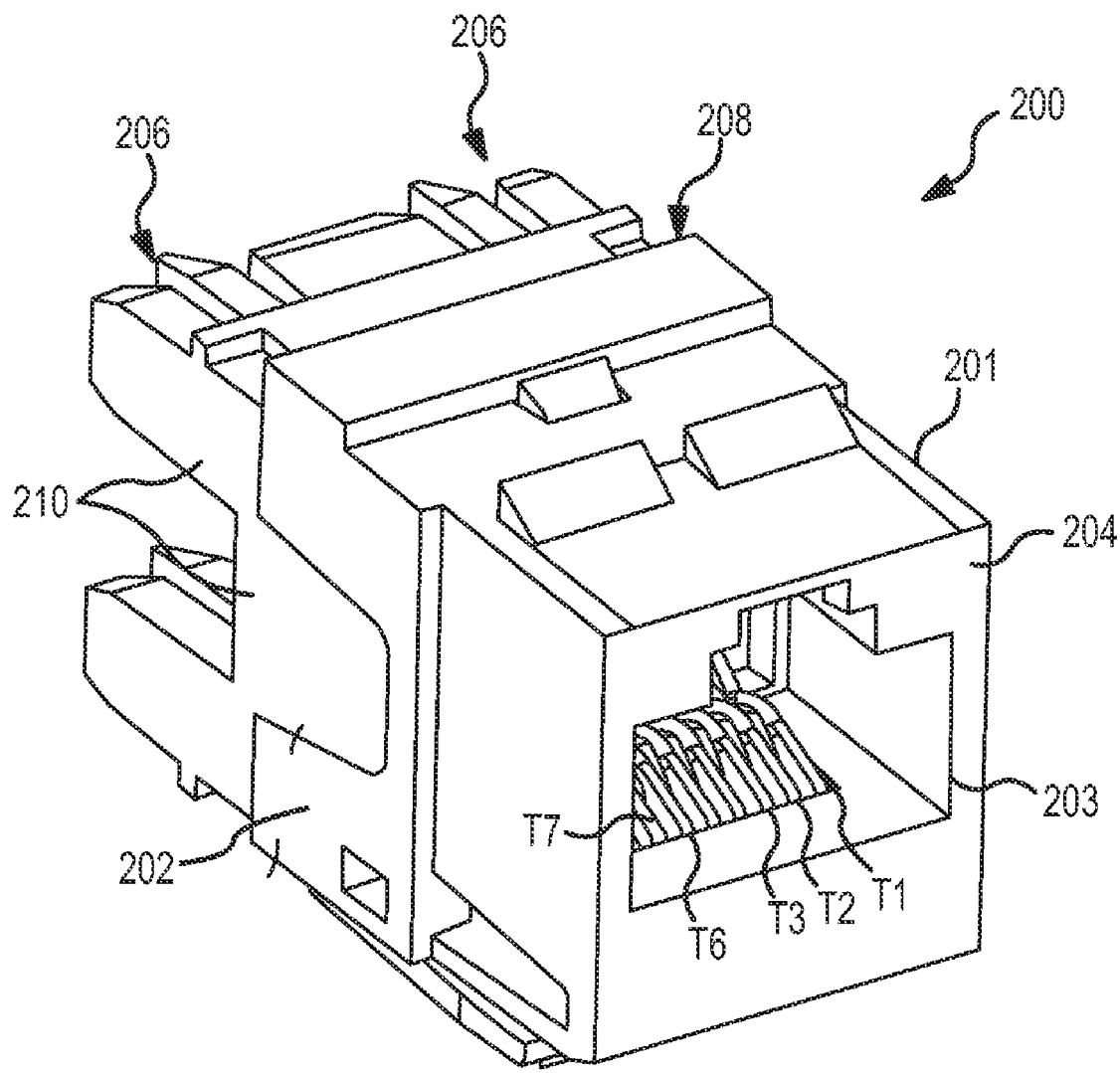
FIG. 2 is a more detailed perspective view of a communications outlet including internal crosstalk, modal alien crosstalk, and alien crosstalk compensation stages according to one embodiment of the present invention.
Figure 3:
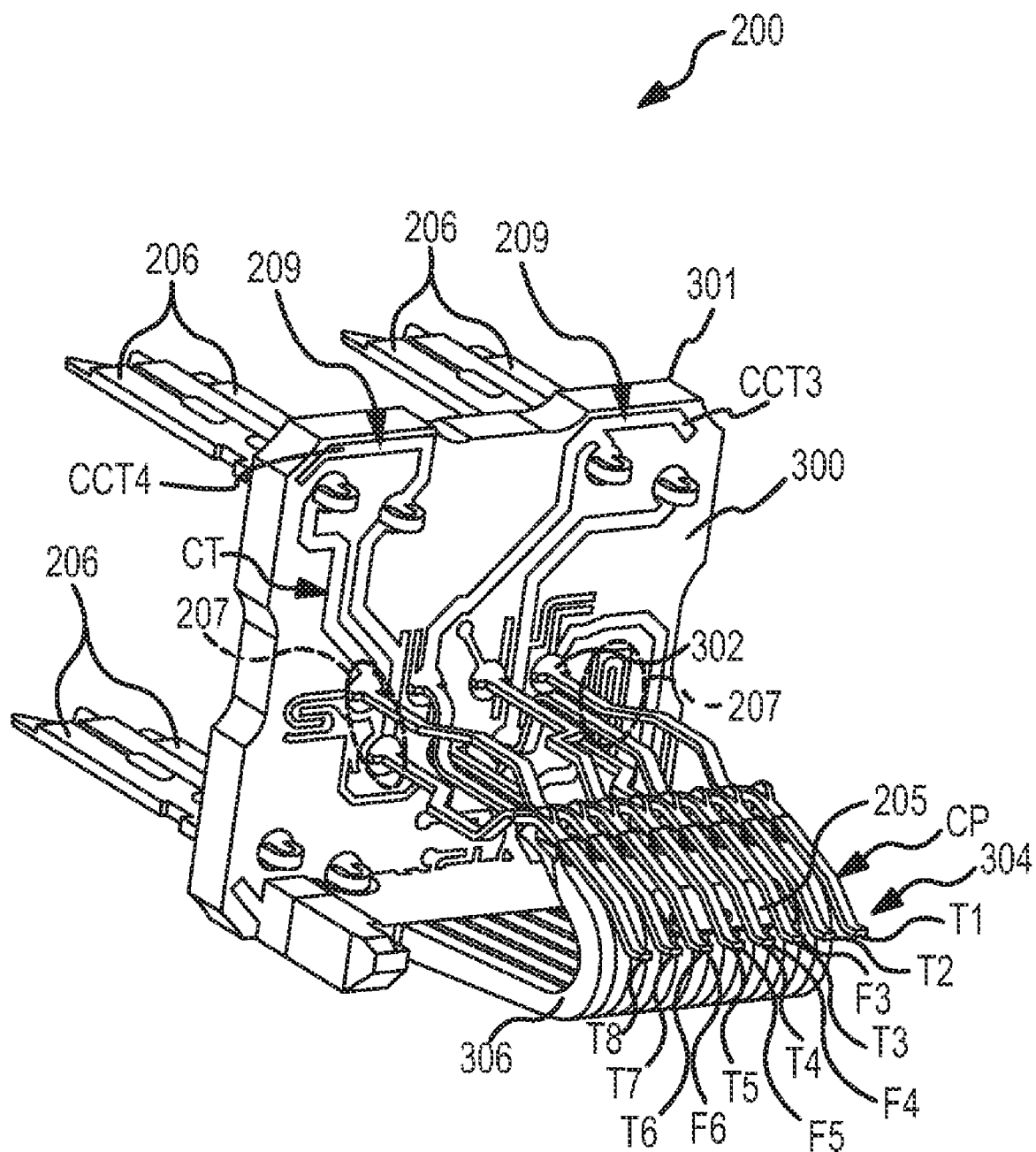
FIG. 3 is a perspective view of the communications outlet of FIG. 2 with the body removed to show in more detail possible locations of the internal crosstalk, modal alien crosstalk, and alien crosstalk compensation stages according to embodiments of the present invention.

Referring to FIG. 2, the outlet 200 includes an insulating housing or body 201 having an electrically conductive shield 202 formed on at least a portion of the outer surface of the insulating body. The electrically conductive shield 202 is illustrated in more detail in subsequent FIGS. 3, 3A, and 3B and will be described in more detail with reference to these subsequent figures. The outlet 200 includes a plurality of resilient conductive outlet tines T1-T8 in parallel arrangement within an interior receptacle 203 of the body. Each of the outlet tines T1-T8 is illustrated in FIG. 3 and several are also shown and labeled in FIG. 2. Note that in the present description, when referring generally to any one of a number of similar components, such as the tines T1-T8, the number designation may be omitted, such as for the tines T. When referring to a specific one or ones of the components, such as tine T4, the number designation will be included. The receptacle 203 is formed in a front 204 of the body 201 and the outlet tines T1-T8 within the receptacle are connected to wire termination contacts 206 (see FIG. 3) situated within a termination block 210 at a back 208 of the body. Wires within a cable (not shown) of a communications channel, such as the channel 101 of FIG. 1, are then connected to the wire termination contacts 206, or otherwise electrically connected, as will be appreciated by those skilled in the art.

FIG. 3 is a perspective view of the communications outlet 200 of FIG. 2 with the insulating body 201 removed to show in more detail the inner structure of the outlet including the internal crosstalk compensation stage 205, modal alien crosstalk compensation stage 207, and alien crosstalk compensation stage 209 according to one embodiment of the present invention. The alien crosstalk compensation stage 209 is formed by the combination of the electrically conductive shield 202 (not shown in FIG. 3) and capacitive coupling traces CCT1-CCT4 formed on a rigid printed circuit board 300 of the communications outlet 200, as described in more detail below. Two of the capacitive coupling traces, namely traces CCT3 and CCT4, are shown in FIG. 3. The wire termination contacts 206 are attached to the rigid printed circuit board 300, and each of the outlet tines T1-T8 has a fixed end 302 that is also attached to the printed circuit board. Conductive traces CT1-CT8, generally designated as simply CT in FIG. 3 (see FIG. 4 for more detail), are formed on the printed circuit board 300 and interconnect the wire termination contacts 206 and fixed ends 302 of the tines T. The capacitive coupling traces CCT1-CCT4 forming part of the alien crosstalk compensation stage 209 are also formed on the rigid printed circuit board 300 in the embodiment of FIG. 3 as previously mentioned. The tines T1-T8 include free ends 304 positioned proximate the front 204 (FIG. 2) of the outlet 200. A contact point CP is shown and corresponds to a point where the tines of a plug (not shown) inserted in the outlet 200 will contact the tines T1-T8 of the outlet. The outlet 200 further includes nonconductive and resilient spring arms 306 positioned under the tines T1-T8 to support the tines.

Figure 3A:
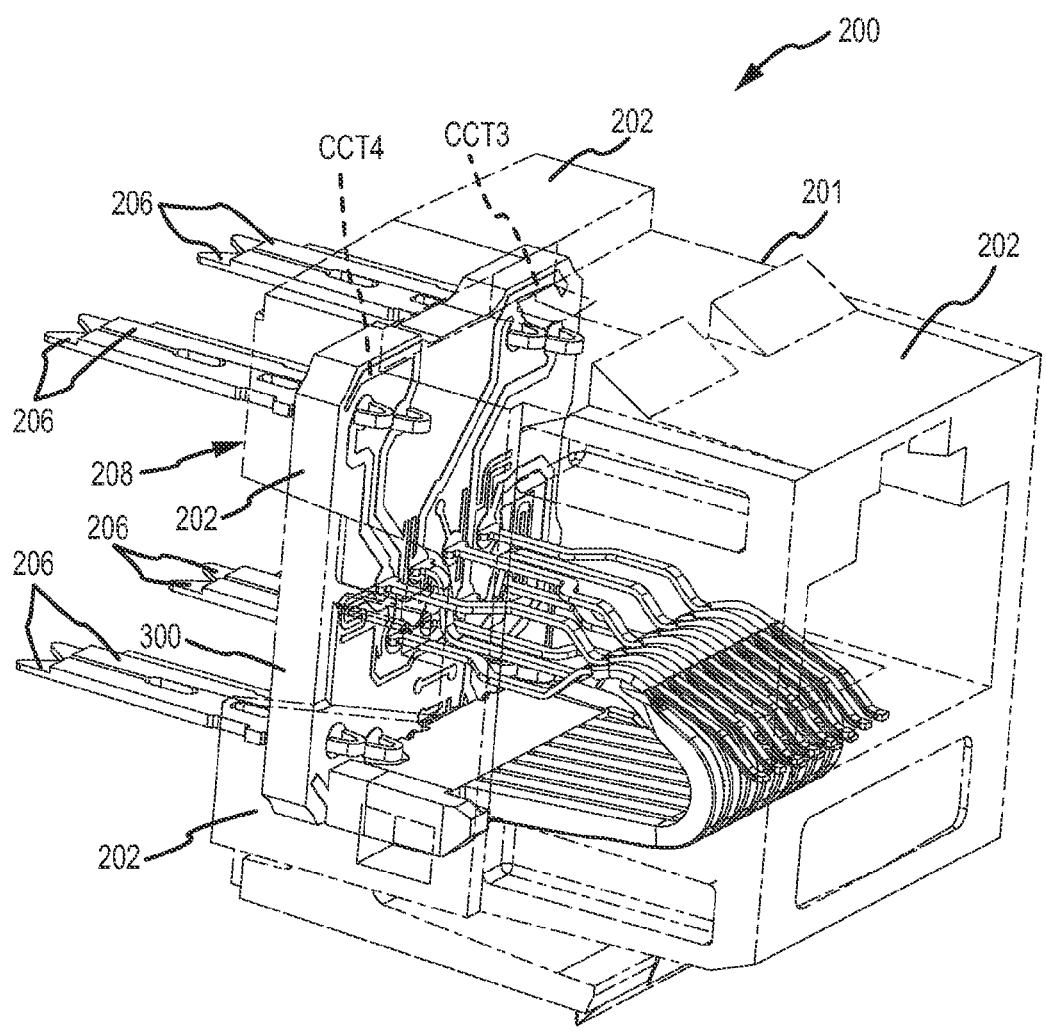
FIG. 3A is another perspective view of the communications outlet of FIG. 2 this time with the body attached but transparent to better illustrate the physical positioning of the electrically conductive shield on the outer surface of the insulating body relative to various components within the outlet.
Figure 3B:
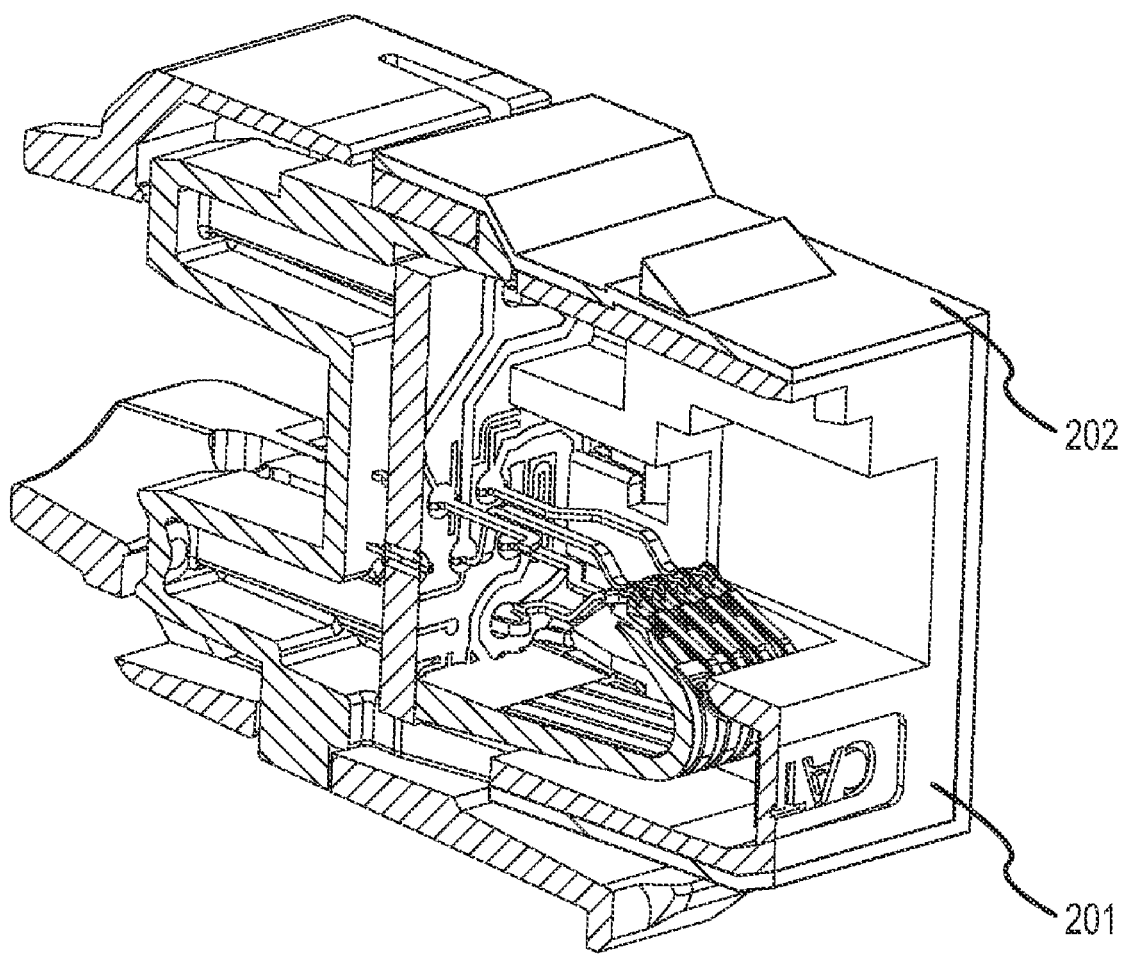
FIG. 3B is a cut-away perspective view of the communications outlet of FIG. 3A showing in more detail the formation of the electrically conductive shield on the outer surface of the insulating body according to one embodiment of the present invention.

FIG. 3A is another perspective view of the communications outlet 200 with the insulating body 201 attached as it would be when the communications outlet is assembled as in FIG. 2. In contrast to FIG. 2, however, in FIG. 3A the insulating body 201 and electrically conductive shield 202 are transparent to better illustrate the physical positioning of the electrically conductive shield relative to the wire termination contacts 206 and capacitive coupling traces CCT1-CCT4 on the rigid circuit board 300. In the embodiment of FIG. 3A, the electrically conductive shield 202 is formed on the outer surface of the body 201, as previously mentioned. FIG. 3B is a cut-away perspective view of the communications outlet 200 of FIG. 3A showing in more detail the formation of the electrically conductive shield 202 on the outer surface of the insulating body 201 according to one embodiment of the present invention. In this embodiment, the electrically conductive shield 202 is formed over the entire outer surface of the insulating body 201 and is floating, meaning the electrically conductive shield is not directly electrically connected to any component or connection within the outlet or to a ground connection. Instead, the floating electrically conductive shield 202 is capacitively coupled to components within the outlet 200, primarily the capacitive coupling traces CCT1-CCT4 and wire termination contacts 206, to form the alien crosstalk compensation stage 209. In other embodiments, the electrically conductive shield 202 is directly connected to circuitry within the outlet 200 or a system containing the outlet, such as a ground reference plane or connection.

In the embodiment of FIGS. 3A and 3B the electrically conductive shield 202 is formed over the entire outer surface of the insulating body 201 to fully enclose the capacitive coupling traces CCT1-CCT4, rigid circuit board 300, tines T and other components within the outlet 200. The electrically conductive shield 202 is formed over only a portion of the outer surface of the insulating body 201 in other embodiments. The electrically conductive shield 202 is formed from a suitable material, such as copper, aluminum, or other type of metal or other highly conductive material. In yet another embodiment, the electrically conductive shield 202 is impregnated within the insulating body 201. Once again, the electrically conductive shield 202 may be contained over the entire body 201 to fully enclose capacitive coupling traces CCT1-CCT4, rigid circuit board 300, tines T and other components, or only over a portion or portions of the body to achieve the desired electrical characteristics.

The electrically conductive shield 202 can be attached to the insulating body 201 in a variety of different ways. For example, as previously mentioned the electrically conductive shield 202 can be formed from an array of conductive fibers encased within the material, such as plastic, forming the insulating body 201. The electrically conductive shield 202 could alternatively be formed from a sheet, such as a sheet of aluminum foil, adhered to the outer surface of the insulating body 201. Such a sheet can be glued, otherwise adhered, or otherwise affixed to the insulating body 201. Finally, in still other embodiments, the electrically conductive shield 202 is not formed in or on the insulating body 201 at all, but is instead formed on other components of the communications outlet 200 or on other separate structures (not shown in FIGS. 3A and 3B) suitably positioned to achieve the desired electrical characteristics to reduce alien crosstalk with adjacent communications outlets.

Figure 4:
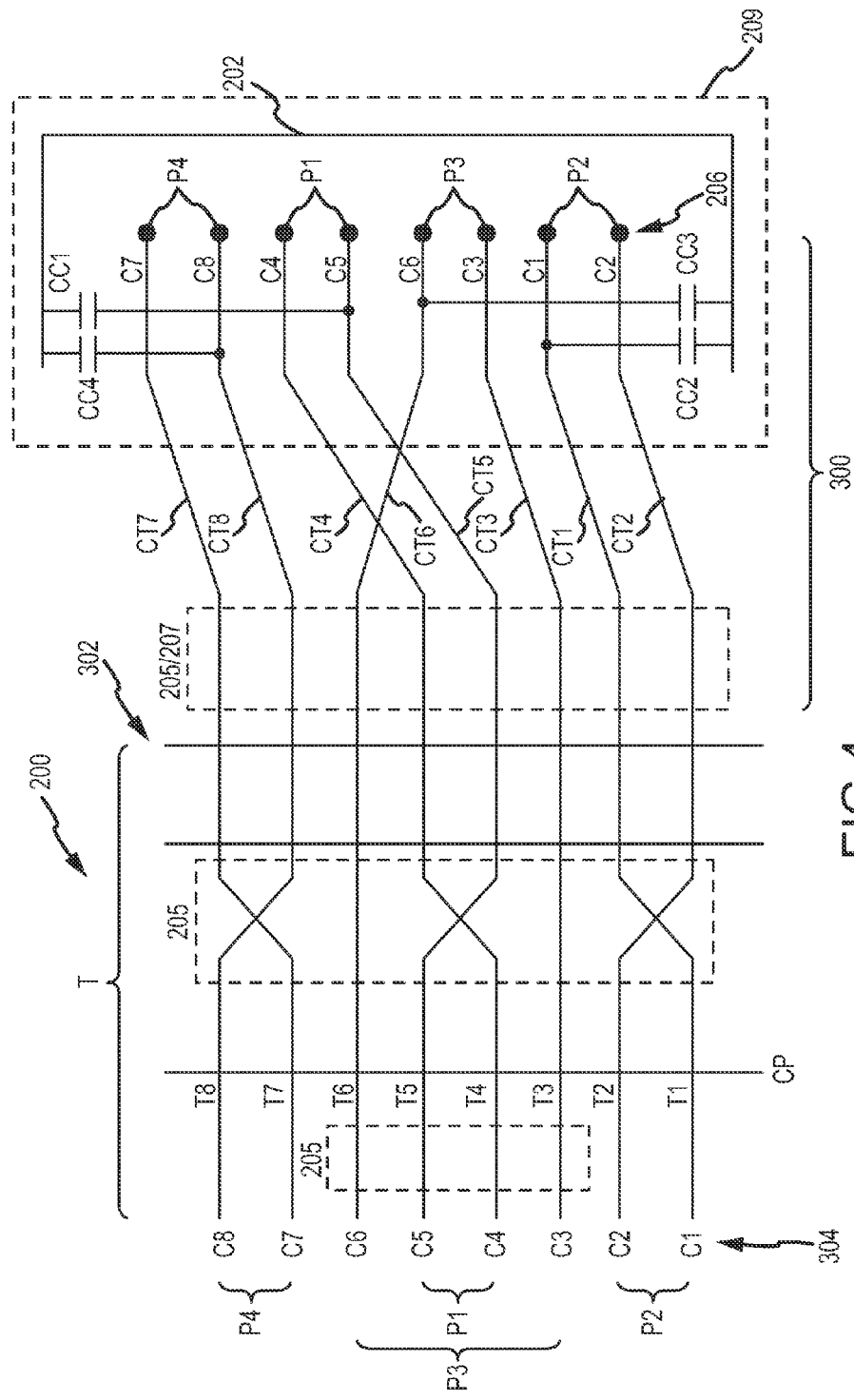
FIG. 4 is a schematic of the communications outlet of FIGS. 2 and 3 including the internal crosstalk, modal alien crosstalk, and alien crosstalk compensation stages according to one embodiment of the present invention.

FIG. 4 is a schematic of the communications outlet 200 of FIGS. 2, 3 and 3A, including the internal crosstalk, modal alien crosstalk and alien crosstalk compensation stages 205, 207 and 209, according to one embodiment of the present invention. Before discussing the operation of the crosstalk compensation stages 205, 207 and 209 in more detail, the schematic will first be discussed more generally and certain terms associated with the outlet 200 will be defined. The outlet 200 includes eight electrically conductive paths or conductors C1-C8. Each of the eight conductors C1-C8 represents the corresponding conductive outlet tine T1-T8, conductive traces CT1-CT8 on the rigid printed circuit board 300 and wire termination contacts 206. The eight conductors C1-C8 form four signal pairs P1-P4, with conductors C4 and C5 being pair P1, conductors C1 and C2 being pair P2, conductors C7 and C8 being pair P4 and conductors C3 and C6 being pair P3. Each pair P1-P4 of conductors C1-C8 carries a corresponding electrical signal, as will be appreciated by those skilled in the art. Note that although the outlet 200 is shown, and will be described as including wire termination contacts 206 on the far right of FIG. 4, the far right ends of each conductor C1-C8 more generally represent the points where a wire of a communications cable (not shown) connects to the conductor. Thus, although these are described herein as being wire termination contacts 206, one skilled in the art will appreciate that other types of conductive contacts could also be utilized, such as terminals, bonding pads, soldering, vias or through holes and so on. The term wire termination contact is used herein to refer generally to all such types of conductive contacts.

In FIG. 4, the portions of the conductors C1-C8 on the left side of the figure correspond to the outlet tines T1-T8 in the outlet 200 (FIG. 3) that extend from the free ends 304 of the outlet tines on the far left to the fixed ends 302 of the outlet tines toward the middle of the figure. The portions of conductors C1-C8 on the right side of the figure represent the conductive traces CT1-CT8 and the wire termination contacts 206 that are situated on the rigid printed circuit board 300 towards the back of the outlet 200. The conductors C1 and C2 of pair P2, C4 and C5 of pair P1 and C7 and C8 of pair P4 "crossover" towards the front of the outlet 200, which is to the left side of FIG. 4. More specifically, the tines T1 and T2 of pair P2, T4 and T5 of pair P1 and T7 and T8 of pair P4 "crossover." These crossovers of pairs P1, P2, and P4 reduce internal crosstalk within the outlet 200, where "internal crosstalk" is the crosstalk that occurs among the pairs P1-P4 of conductors C1-C8 within an individual outlet and communications channel 101 (FIG. 1), as previously discussed. The crossovers of pairs P1, P2 and P4 thus constitute part of internal crosstalk compensation stage 205.

The alien crosstalk compensation stage 209 is formed by the conductive shield 202 in combination with the capacitive coupling traces CCT associated with each pair P1-P4, two of which are shown in FIG. 3. The conductive shield 202 is represented in FIG. 4 as two lines at the top and bottom right of the schematic of FIG. 4. The capacitance formed between conductive shield 202 and each capacitive coupling trace CCT is represented as a corresponding coupling capacitor CC1-CC4. Each coupling capacitor CC1-CC4 is associated with a particular pair P1-P4. The coupling capacitor CC1 is associated with pair P1, capacitor CC2 with pair P2, capacitor CC3 with pair P3 and capacitor CC4 with pair P4. More specifically, the coupling capacitor CC1 is formed by the conductive shield 202 and corresponding coupling trace CCT on rigid circuit board 300, where this coupling trace is connected to conductive trace CT5 of conductor C5 of pair P1. Similarly, the coupling capacitor CC2 is formed by the conductive shield 202 and corresponding coupling trace CCT on rigid circuit board 300, where this coupling trace is connected to conductive trace CT1 of conductor C1 of pair P2. The coupling capacitors CC3 and CC4 are formed by the conductive shield 202 and corresponding coupling traces CCT on rigid circuit board 300 where these coupling traces are connected to conductive traces CT6, CT8 of conductors C6, C8 of pairs P3, P4. The coupling capacitors CC1-CC4 of the alien crosstalk compensation stage 209 reduce the susceptibility of the outlet 200, and thus the communications channel containing the outlet to alien crosstalk from proximate outlets and communications channels, as well as alien crosstalk generated by the outlet, as will be described in more detail below.

The operation of each of the internal crosstalk compensation stages 205, modal alien crosstalk compensation stage 207 and alien crosstalk compensation stage 209 will now be discussed in more detail. It should be noted, however, that the modal alien crosstalk compensation stage 207 is described in detail in co-pending U.S. patent application Ser. No. 12/401,587, filed Mar. 10, 2009, and the present application is a continuation in part of the Ser. No. 12/401,587 application. The same is true for the internal crosstalk compensation stage 205 which is described in detail in co-pending U.S. patent application Ser. No. 12/234,597, filed Sep. 19, 2008, of which the present application is also a continuation in part. Because the internal crosstalk compensation stage 205 and modal alien crosstalk compensation stage 207 are described in detail in the Ser. Nos. 12/234,597 and 12/401,587 applications, respectively, these compensation stages will not again be described in detail herein, but instead these two compensation stages are described generally herein and reference can be made to these prior applications for additional details about the structure and operation of these stages.

Turning now to the internal crosstalk compensation stage 205, this stage is formed on a flexible printed circuit board positioned under the tines T1-T8 as shown in FIG. 3. More specifically, the flexible printed circuit board has fingers that are physically and electrically attached to the tines T3-T6 very near contact points CP where the tines of a plug (not shown) inserted in the outlet 200 contact the tines T1-T8. In the present description the term "mated plug-outlet combination" may be utilized to mean an outlet with a plug inserted into that outlet. In operation, the internal crosstalk compensation stage 205 includes capacitive components that provide positive compensation between pair P1 (tines T4, T5) and pair P3 (tines T3, T6), thereby reducing or compensating for a significant amount of internal crosstalk that may otherwise be generated within the outlet 200 such that the outlet and communications channels, including the outlet, meet required crosstalk levels at high frequencies such as those required for CAT6 and CAT6A outlets. This internal crosstalk is most prevalent between pairs P1 and P3 due to the separation or "splitting" of the conductors C3 and C6 of pair P3, with pair P3 commonly referred to as the "split pair." The reasons for the presence of the split pair (i.e., using conductors C3 and C6 as pair P3) are historical and current outlets maintain this configuration for compatibility reasons.

The internal crosstalk compensation stage 205 includes capacitive components (not shown) formed on the flexible printed circuit board to provide the positive compensation between pairs P1 and P3 as described in greater detail U.S. patent application Ser. No. 12/234,597. The physical location of the flexible printed circuit board on which this portion of the internal crosstalk compensation stage 205 is formed provides a space saving solution to supply the required positive compensation. The flexible printed circuit board also provides desirable mechanical support for the tines T3-T6 which, in turn, provides even spacing of these tines and eliminates the need for combs or other components to ensure proper spacing. The location of the flexible printed circuit board also allows the board to be installed by a machine during assembly of the outlet 200 and does not require hand installation.

Internal crosstalk compensation stage 205 also includes a second capacitive and inductive compensation stage created by tine T crossover configurations as well as a third capacitive compensation stage on the rigid printed circuit board 300 that provides additional positive compensation between pairs P1 and P3. All three stages of internal compensation combine to form the internal crosstalk compensation stage 205 and work to further reduce internal crosstalk in the outlet 200 and thus in communications channels containing the outlet.

Turning now to the modal alien crosstalk compensation stage 207, this stage includes a number of independent capacitive elements (shown generally in FIG. 3 but not in FIG. 4) that function to introduce common mode signals onto the second and fourth pairs P2 and P4 of outlet tines T, and/or their associated circuit paths, responsive to signals on the conductors C3 and C6 of the split pair P3. The unequal electrical exposure of conductors C3, C6 of the split pair P3 in the plug of a mated plug-outlet combination would otherwise cause, at high frequencies, unwanted common mode signals to be induced or generated on both conductors C1, C2 of pair P2 and on both conductors C7, C8 of pair P4 in the plug and outlet 200. The independent capacitive elements of the modal alien crosstalk compensation stage 207 introduce common mode signals onto the conductors C1, C2 of pair P2, and conductors C7, C8 of pair P4, that tend to cancel or reduce the common mode signals on these pairs caused by the unequal electrical exposure of these pairs to the conductors C3, C6 of the split pair P3. In this way, the modal alien crosstalk compensation stage 207 reduces the modal alien crosstalk between and among adjacent communications channels including outlets 200.

In the embodiment of the outlet 200 illustrated through the schematic of FIG. 4, the modal alien crosstalk compensation stage 207, and independent capacitive elements thereof, are shown as being formed on the rigid printed circuit board 300 previously described with reference to FIG. 3. In another embodiment, the first modal alien crosstalk compensation stage 207 and corresponding capacitive elements may be formed on the same flexible printed circuit board on which the internal crosstalk compensation stage 205 is formed.

The modal alien crosstalk compensation stage 207 enables existing outlet structures to function satisfactorily at high frequencies, such as those required for CAT6 and CAT6A outlets, without requiring significant changes to the mechanical structure of the existing outlets. For example, no structural changes need be made to tines T3 and T6. Such changes, while they could be made to existing outlets to provide desired modal alien crosstalk compensation, complicate the mechanical structure of the outlet. A more complicated mechanical structure would typically make the outlet more expensive to manufacture, less reliable, and reduce the usable life of the outlet.

As will be appreciated by those skilled in the art, there are two standardized wiring conventions, T568A and T568B, for assigning pairs P to conductors C within the plug (e.g., plugs 104, 126 of FIG. 1) and communications outlets (e.g., outlet 200). For all practical purposes, these two standardized wiring conventions T568A, T568B are identical with the exception that the pairs P3 and P2 are interchanged. The T568B standardized wiring format is illustrated in FIG. 4 and will be discussed in the present application although one skilled in the art will understand that the present invention and description thereof herein apply to the T568A convention also, as well as to any other similar arrangement of wires independent of actual pair number assignments utilized.

Figure 5:
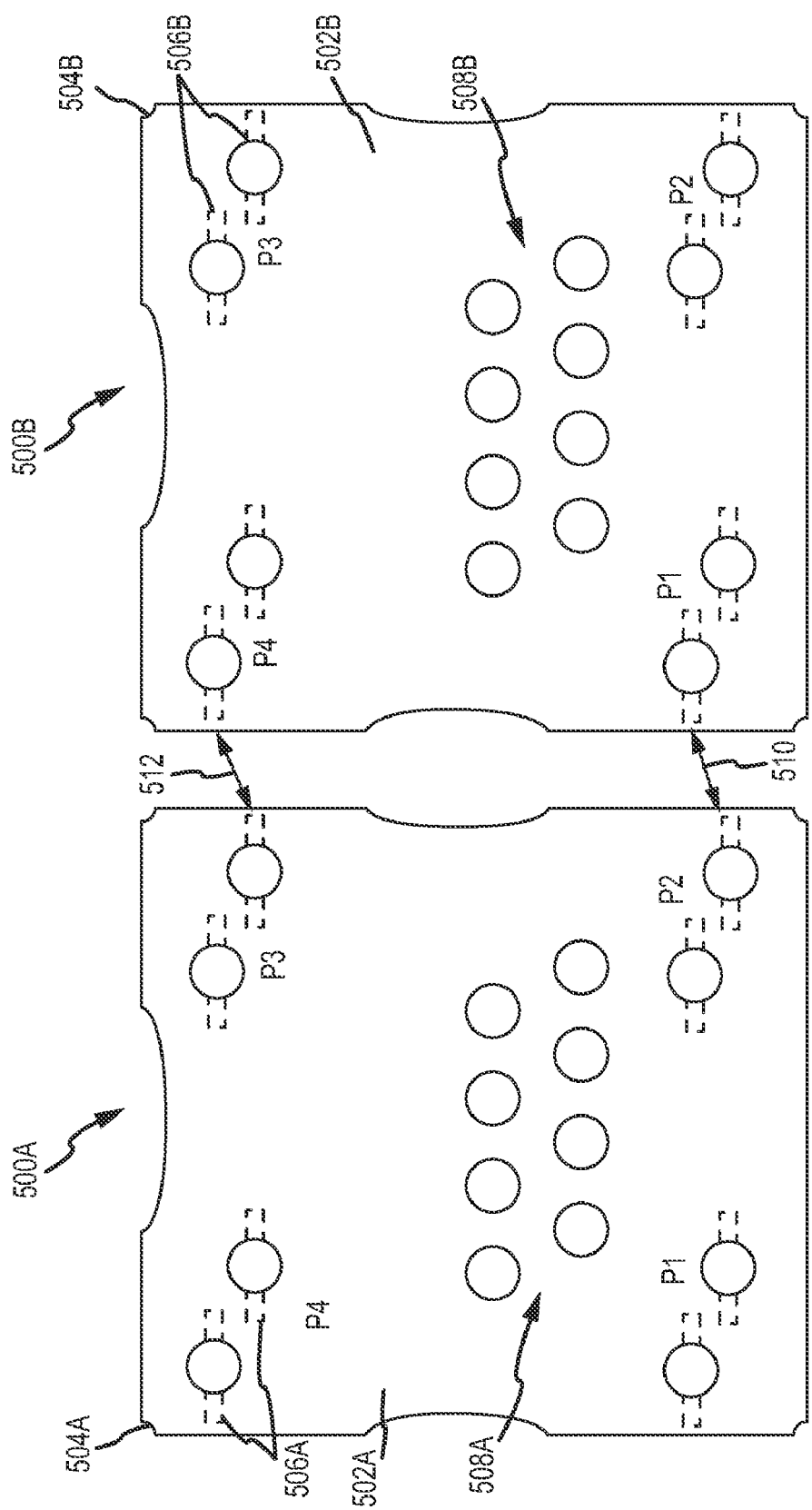
FIG. 5 is a representative front view of the rigid printed circuit board of a first and second conventional communications outlet positioned side-by-side and contained within a conventional insulating body for each of these communications outlets.

The structure and operation of the alien crosstalk compensation stage 209 will now be described in more detail. FIG. 5 is a front view of first and second conventional communications outlets 500A and 500B positioned side-by-side. This view shows rigid printed circuit boards 502A, 502B contained within insulating bodies 504A, 504B for each of the communications outlets 500A, 500B. The pairs P1-P4 are labeled for each outlet 500A, 500B and, the wire termination contacts 506A, 506B, which are insulation displacement connectors (IDCs) in this example, are indicated for the pair P4 of the outlet 500A and the pair P3 for the outlet 500B. Also shown are through holes 508A and 508B in the rigid circuit boards 502A and 502B, respectively, through which the fixed ends (302 in FIG. 3) of the tines T (not shown) are positioned for each of the outlet 500A, 500B.

When the communication outlets 500A, 500B are positioned proximate one another as shown in FIG. 5, alien crosstalk, or more specifically alien near end crosstalk (ANEXT) and power sum ANEXT (PSANEXT), occurs between the outlets. These types of crosstalk are understood by those skilled in the art and are discussed in more detail in the Ser. No. 12/401,587 application. Accordingly, for the sake of brevity, the details of these types of alien crosstalk will not be described in detail herein. The large surface area of the IDCs 506A, 506B of the pairs P1-P4 of each outlet 500A, 500B results in a relatively strong coupling of signals on the IDCs of one outlet to adjacent IDCs of the adjacent outlet. The conductive traces CT (see FIG. 3) on the rigid printed circuit boards 502A, 502B interconnecting the IDCs 506 and tines (not shown) also add to the level of PSANEXT between the outlets 500A, 500B. The same is true for the capacitive components of the internal crosstalk compensation stage 205 (see FIG. 4) where the internal crosstalk compensation stage can include a second stage tine crossover and an additional third stage capacitive compensation formed on the rigid printed circuit boards 502A, 502B.

FIG. 6 is a table illustrating the relative levels of PSANEXT between the pairs P1-P4 in the first and second communications outlets 500A, 500B when the outlets are positioned as shown in FIG. 5. As seen in the table of FIG. 6, the strongest coupling occurs between pair P2 of outlet 500A and the pair P1 of outlet 500B as indicated by arrow 510 in FIG. 5 and the term "HIGH" in the table. This is true because, as seen in FIG. 5, these two pairs P are positioned close together. The same strong level of coupling also occurs between pair P3 of outlet 500A and pair P4 of outlet 500B as seen in the table of FIG. 6 and indicated by arrow 512 in FIG. 5. The table shows that the coupling for most of the pairs P is not quite as strong, and is thus designated as medium or "MED," as that for the pairs P1 and pairs P4 in the outlets 500A, 500B. As seen FIG. 5, these pairs are quite a bit farther apart than are those pairs P designated as having HIGH coupling. The table of FIG. 6 also shows that four pairs P have the weakest coupling, designated "LOW," as that for the pair P4 of outlet 500A and pair P3 of outlet 500B. Referring to FIG. 5, it is apparent these pairs are the farthest apart and thus exhibit the weakest coupling.

FIG. 7 is a table illustrating the relative levels of PSANEXT between the pairs P in the first and second communications outlets 500A, 500B when the positions of the outlets are reversed relative to that shown in FIG. 5, where the outlet 500A is now to the right of the outlet 500B. Once again the table shows that in the majority of cases, the coupling between the pairs is medium MED, in two cases the coupling is strong or HIGH, and in four cases the coupling is weakest LOW. Note that the particular pairs P experiencing the medium, strong, and weakest coupling is different in the table of FIG. 7 than the table of FIG. 6 due to the relative repositioning of the outlets 500A, 500B for the two tables.

Figure 8:
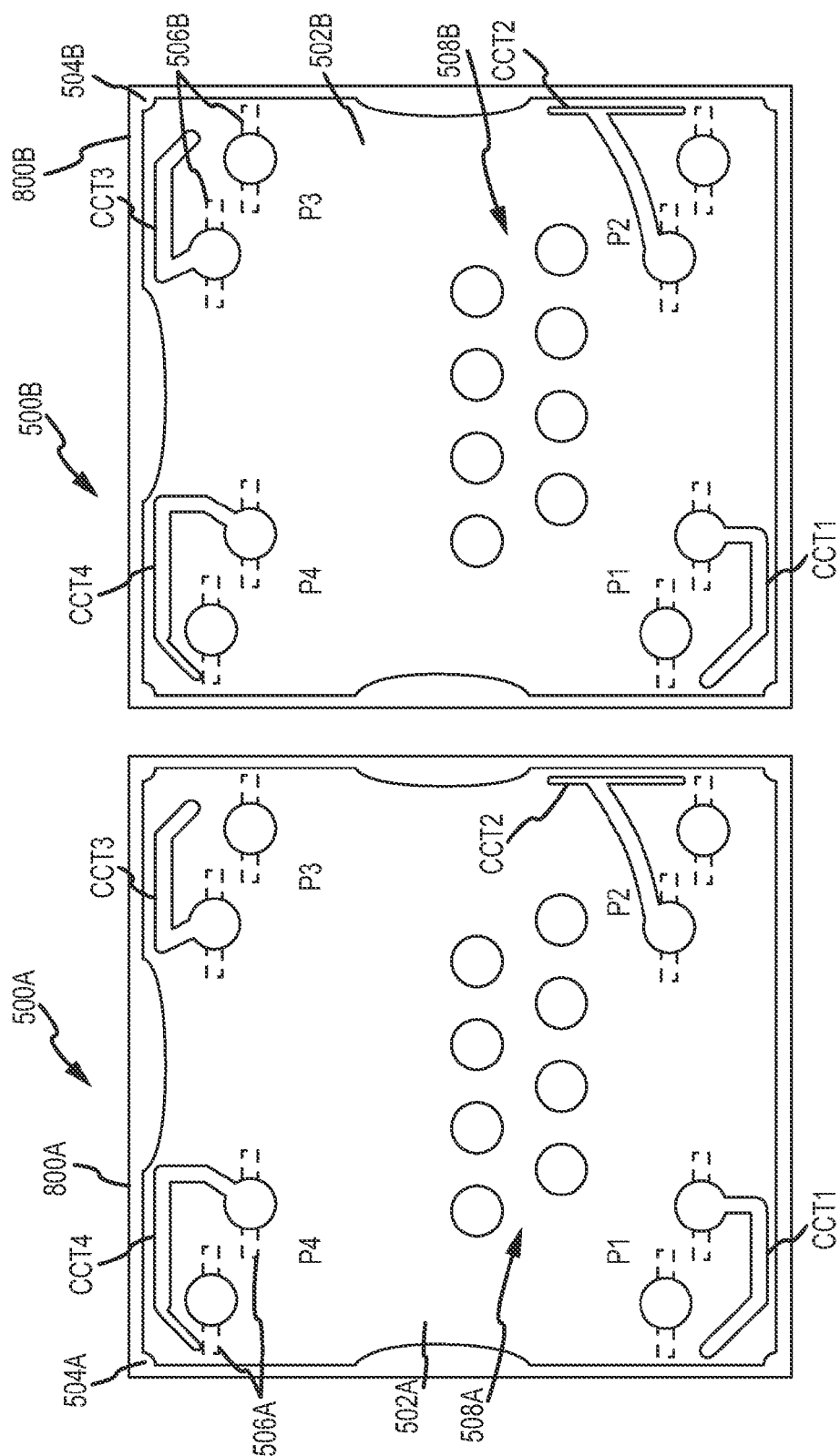
FIG. 8 is a representative front view of the rigid printed circuit board of a first and second communications outlet positioned side-by-side and including an electrically conductive shield formed on the outer surface of the insulating body for each of the outlets.

The alien crosstalk between the communications outlets 500A and 500B of FIG. 5 can be greatly reduced by placing respective conductive shields 800A, 800B around the insulating bodies 504A, 504B of the communications outlets 500A, 500B as shown in FIG. 8. The insulating bodies 504 can be selectively plated with copper or other high conductivity material on the outer surface of the bodies, as previously described for the insulating body 201 of FIGS. 2, 3 and 3A. As previously mentioned, the entire outer surface, or selected portions thereof needed for isolation, can be plated.

The utilization of the conductive shields 800 on the insulating bodies 504 can work well for many frequencies of operation for the outlets 500. In some cases, however, particularly as the frequency of operation increases, resonant frequencies can arise at which signals can be generated on the conductive shields 800. This is true because the conductive shields 800 are floating (i.e., are not connected to any reference voltage of the circuit containing the outlets 500). The signals generated on the conductive shields 800 can, in turn, radiate from one shield to the next and, in this way, from one outlet 500 to the next causing increased levels of alien crosstalk at these resonant frequencies. This is seen in the graph of FIG. 9 which illustrates alien crosstalk levels in decibels as a function of frequency between the communications outlets 500A and 500B of FIG. 8. This graph shows that at some frequencies, unwanted resonant peaks can occur causing the alien crosstalk to reach or exceed desired limits. A top line 900 in the graph represents the desired limit values and the lower lines represent the alien crosstalk on the pairs P1-P4 of the outlets 500.

Figure 10:
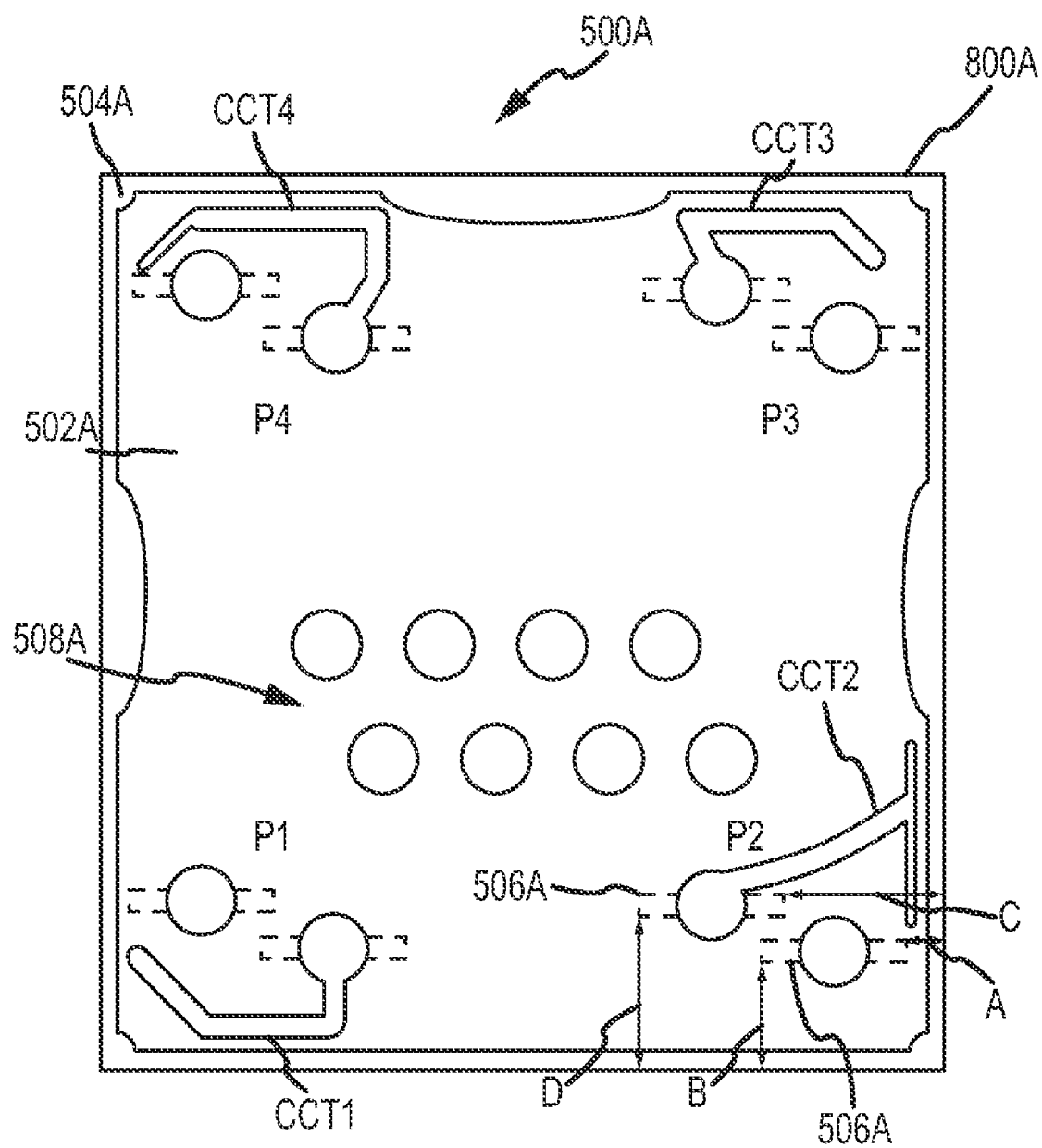
FIG. 10 is a representative front view of the rigid printed circuit board of one of the communications outlets of FIG. 8 that illustrates in more detail the capacitance between each of the insulation displacement connectors in one of the pairs and the electrically conductive shield formed on the outer surface of the insulating body.

In addition to resonant peaks that occur due to the conductive shields 800 floating, each IDC 506 within a pair P in each outlet 500 sees an unequal level of coupling to the conductive shield 800. This is true because the effective coupling between each of the IDCs 506 in each pair P to the conductive shield 800 is dependent on its physical distance from the shield, and its surface area exposed to the shield, as illustrated in FIG. 10. FIG. 10 is a front view of one of the communications outlets 500A of FIG. 8 that illustrates in more detail the distances between the conductive shield 800a and each of the IDCs 506A in the pair P2. Only the IDCs 506A of pair P2 are discussed in more detail with reference to FIG. 10, but the same concepts apply to all IDCs and pairs P of the outlets 500A and 500B.

Figure 9A:
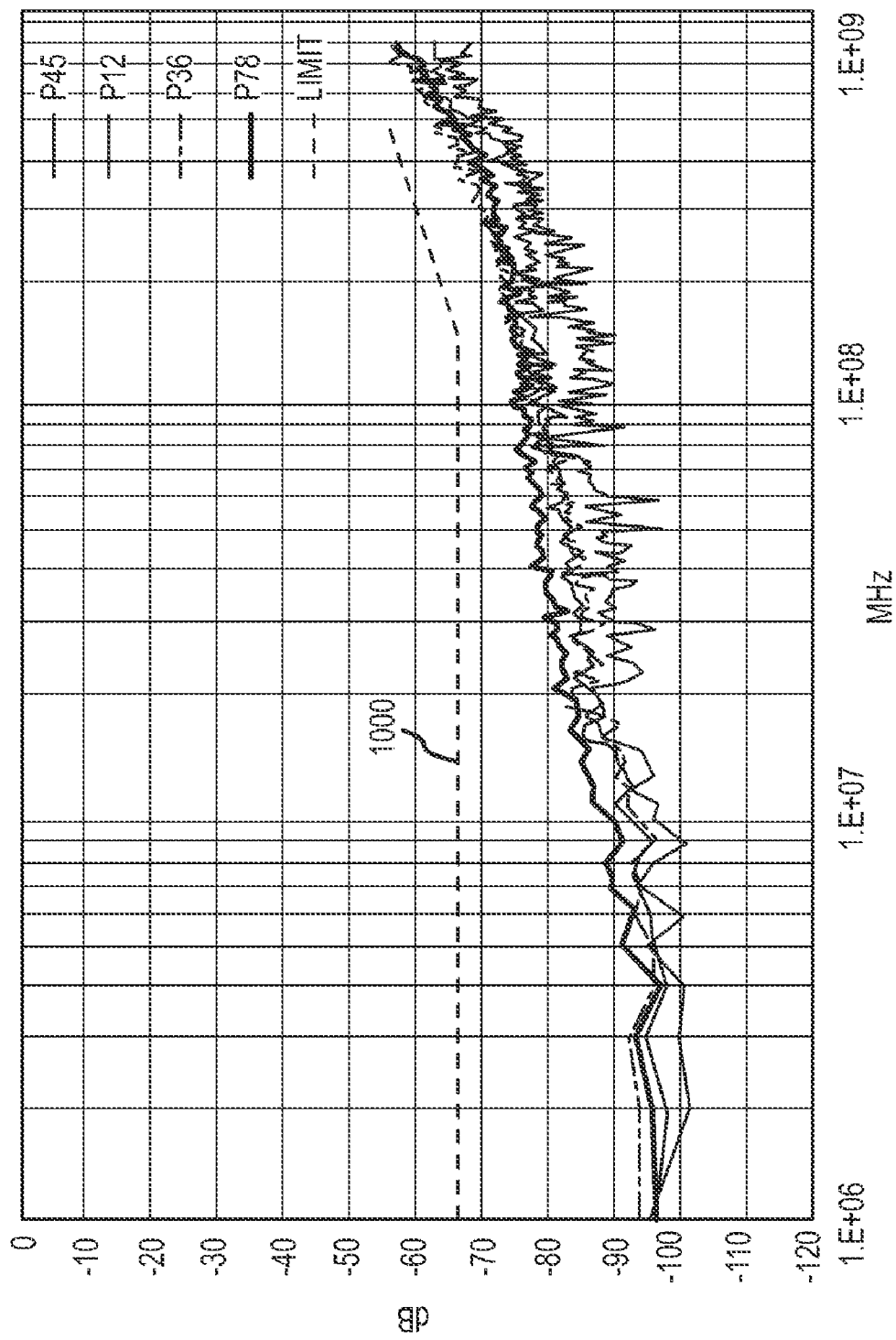
FIG. 9A is a graph illustrating alien crosstalk levels as a function of frequency between pairs in two communications outlets in close proximity to each other without the unwanted resonant peaks.

The IDCs 506A of the pair P2 must see equal capacitive coupling to the conductive shield 800A for the differential signal across the IDCs of pair P2 to not generate a common mode signal on the conductive shield 800A. If such a common mode signal is generated on the conductive shield 800A, which is floating as previously described, a resonance condition can occur that causes undesired peaks in the levels of PSANEXT in the outlet 500A as previously discussed with reference to FIG. 9. Both the IDCs 506A and the layout of the conductive traces CT (not shown) on the rigid printed circuit board 502A, and any crosstalk-related coupling capacitors on rigid printed circuit board, determine whether the outlet 500A will have such PSANEXT resonant peaks. The graph in FIG. 9A is an example of good PSANEXT performance, meeting the required PSANEXT specification without resonant peaks and which can be achieved with communications outlets containing embodiments of the present invention. A top line 1000 in the graph of FIG. 9A represents desired limit values and the lower lines represent alien crosstalk on the pairs P1-P4 of the outlets 500A, 500B. The graph illustrates these crosstalk levels are well below the limit values corresponding to line 1000.

For each of the IDCs 506A of the pair P2 to see the same capacitive coupling to the conductive shield 800A, the effective distance, comprised of the sum of the distances C and D, for a first one of the IDCs of the pair P2 must equal the sum of the effective distance, comprised of the sum of the distances A and B, for the other one of the IDCs of the pair P2. This is true because the value of a parallel-plate capacitor is given by $C=(\in A/d)$ where is the permittivity of a dielectric between the parallel plates, A is the area of the plates, and d is the distance between the plates. The capacitance between the first one of the IDCs 506A and the conductive shield 800A can be written as $C_{IDC1}=(\in A/(C+D))$ for some equivalent area A, while the capacitance between the second one of the IDCs 506A and the conductive shield can be written as $C_{IDC2}=(\in A/(A+B))$ for some equivalent area A. In looking at FIG. 10, it is seen that the sum C+D for the first one of the IDCs 506A will be greater than the distances A+B for the other one of the IDCs. To make the two equal, the effective distance defined by the values C and D must be decreased until C+D=A+B. The effective values of the distances C and D are decreased by adding the capacitive coupling trace CCT as shown in FIG. 10.

Figure 11:
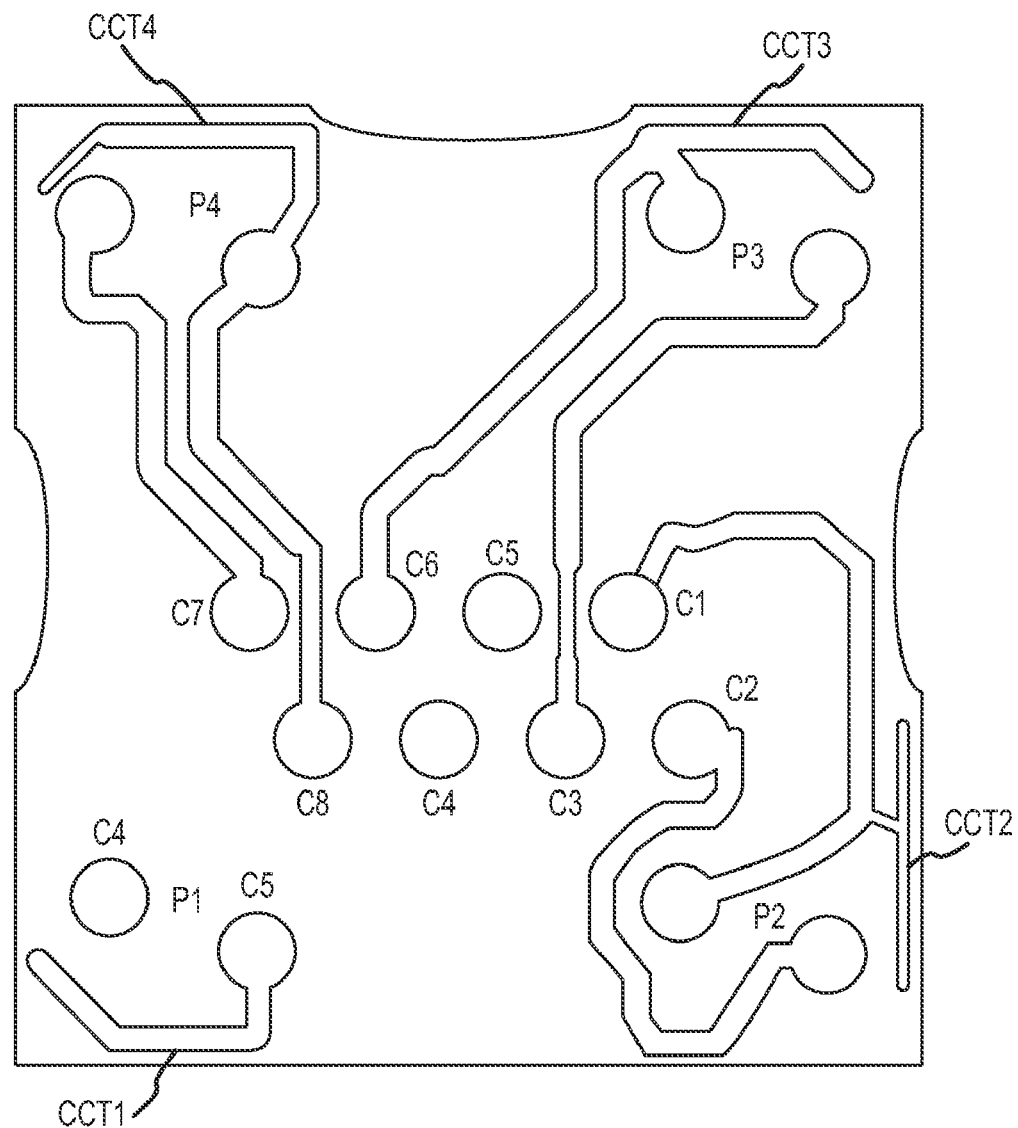
FIG. 11 is a representative front view of the rigid printed circuit board in the communications outlet of FIGS. 2 and 3 illustrating in more detail coupling traces added on the rigid printed circuit board for selected conductive paths of the pairs.

FIG. 11 is a front view of the communications outlet 200 of FIGS. 2, 3 and 3A and illustrates in more detail the capacitive coupling traces CCT1-CTT4 added on the rigid printed circuit board 300 for selected conductors C. The capacitive coupling traces CCT1-CTT4 are added to balance the coupling of each IDC 206 in a given pair P with the conductive shield 202. Thus, for example, the capacitive coupling trace CCT2 is connected to the conductor. C1 of the pair P2 to thereby balance the coupling of the corresponding IDC and the other IDC in pair P2 to the conductive shield 202. The same is done for each of the pairs P1, P3 and P4 with the corresponding capacitive coupling trace CCT1-CTT4 being connected to the appropriate conductor C and IDC 206. Note that although in the above description, the capacitive coupling between the IDCs and the conductive shield 202 is described as being balanced via the capacitive coupling traces CCT1-CCT4, it is the capacitive coupling between each electrically conductive path or conductor C, which includes the IDC 206 that is being balanced through the capacitive coupling traces. The distances A, B, C and D of FIG. 10 are thus effective distances associated with each electrically conductive path C and the conductive shield 202. The capacitance of the IDCs 206 was previously discussed because most of the capacitive coupling to the conductive shield 202 would typically result from the IDCs due to the relatively large size and shape of the conductive plate portions of the IDCs.

Once it is determined which IDC 206 of a pair P has the greatest coupling to the conductive shield 202 using the formula $C=(\in A/d)$, the weakest coupling IDC in the pair P then needs to have the appropriate capacitive coupling trace CCT added. Each trace CCT will typically include a segment that runs parallel to the conductive shield 202, providing the required increased coupling for this conductor C and IDC 206 to balance it with the other conductor and IDC of the pair P. Each pair P may require a different amount of coupling based upon the other circuitry of the outlet 200 and the position of the conductive shield 202 relative to that pair P as is the case when the capacitive coupling traces CCT1-CCT4 are not identical for all the pairs P1-P4. The capacitive coupling traces CCT1-CCT4 for each pair P may be located on either side of the rigid printed circuit board or within the printed circuit board if more than two layers are used.

The alien crosstalk compensation stage 209 formed by the capacitive coupling traces CCT1-CCT4 and conductive shield 202 greatly improves the ANEXT performance of the outlet 200 and eliminates, or greatly reduces, resonant peaks caused by the floating conductive shield 202. The capacitive coupling traces CCT1-CCT4 make the conductive shield 202 electrically neutral relative to each pair P so that little or no coupling occurs when another communications outlet is positioned proximate the communications outlet 200.

In the above described embodiments, the conductive shield 202 is made electrically neutral relative to the conductors C of each pair P through the capacitive coupling traces CCT1-CCT4 formed on the rigid printed circuit board 300. In other embodiments, other "conductive elements" can be used in place of these capacitive coupling traces CCT1-CCT4 to electrically neutralize each pair P relative to the conductive shield 202. For example in another embodiment, instead of using the capacitive coupling traces CCT, one or both of the IDCs in each pair P, and/or the associated conductor C, is physically repositioned in such a way as to equalize the coupling of conductors of each pair to the floating shield. This repositioning could also include the angling of the surfaces of one or both of the IDCs of each pair P to the surfaces of the conductive shield 202. Unfortunately, because of the desired physical design characteristics of the communications outlet 200, the ability to reposition the IDCs is often substantially limited. An alternative to equalizing capacitive coupling to the conductive shield 202 through repositioning of the IDCs is a combination of some change in IDC positioning in addition to the inclusion of capacitive coupling traces CCT.

In yet another embodiment, conductive elements are formed on some of the IDCs to alter the geometry of at least some of the IDCs and thereby adjust the capacitive coupling of these IDCs to the conductive shield 202. For example, instead of repositioning the IDCs, conductive elements could be attached to some of the IDCs to adjust the capacitive coupling of these IDCs to the conductive shield 202 including, but not limited to, metallic projections clipped, soldered or otherwise attached to selected IDCs to adjust the capacitive coupling to the conductive shield as desired.

In yet another embodiment, the conductive shield 202 is not formed in, or on, the insulating body 201 but is instead formed on other existing or new components in the communications outlet 200. In either case, the shield 202 is positioned to provide improved ANEXT performance. For example in another embodiment, the shield 202 or a portion thereof could be formed on the termination block 210 (see FIG. 2). The shield 202 could also be formed from suitable planar conductive elements (not shown) attached along the edges of the rigid printed circuit board 300, each such planar conductive element extending parallel to a corresponding side of the body 201. Other embodiments are of course possible, with each embodiment suitably positioning the conductive shield 202 and adding conductive elements as necessary to approximately equalize the capacitive coupling of the conductors C in each pair P of the outlet 200 with the conductive shield. Moreover, although the embodiments described herein include eight conductive paths or conductors C, in other embodiments the outlet has fewer or more conductive paths C and pairs P.

Referring back to FIG. 3, the eight inline resilient conductive tines T are mechanically supported by the resilient non-conductive spring arms 306 as previously discussed with reference to FIG. 3 and as described in more detail in U.S. Pat. Nos. 6,641,443 and 6,786,776. The tines T are arranged within the outlet 200 in such a manner as to accept a mating RJ45 plug assembly which is not shown in any of the above-described figures but is understood by those skilled in the art. A first stage internal crosstalk compensation stage is located just above the point of contact CP for contacts or tines of the plug on the free ends 304 of the tines T. This first stage internal crosstalk compensation stage is formed on a flexible printed circuit board physically and electrically connected to the tines T proximate contact points CP as previously mentioned. More details of this stage are described in U.S. patent application Ser. No. 12/234,597 as well as related U.S. Pat. Nos. 6,464,541 and 6,139,371.

After the point of contact CP, the tines T have electrical crossovers on pairs P2, P4 and the split pair P3 located between the contact point and the rigid circuit board 300 as shown in, and previously described with reference to, FIG. 4. These crossovers further reduce high-frequency internal crosstalk, as described in more detail in U.S. Pat. No. 5,186,647, by swapping the positioning of tip/ring polarity of a pair P to reduce coupling to an adjacent pair where one of the conductors C in each pair is commonly referred to as a "tip" conductor and the other as a "ring" conductor.

Additional internal crosstalk cancellation is located on the rigid printed circuit board 300 near the base or fixed ends 302 of the tines T. This additional stage works together with the tine crossovers and first stage capacitive compensation to complete the overall internal crosstalk compensation of the outlet 200 and is described in more detail in U.S. Pat. No. 6,379,157.

Due to the nature of the arrangement of the tines T to include the split pair P3, modal alien crosstalk begins to occur at the mated plug/outlet assembly and is then generated throughout the communications channel including the outlet 200. The rigid printed circuit board 300 corrects this problem by providing modal crosstalk compensation at the base or fixed ends 302 of the tines T through opposite polarity capacitive compensation as described in more detail in U.S. patent application Ser. No. 12/401,587. Additional internal NEXT cancellation circuitry is combined on the same rigid printed circuit board 300 while at the same time providing signal paths to the wire termination contacts 206 (IDCs in the illustrated embodiments) end of the outlet 200 at the cable entry point of the outlet.

Finally, there is ANEXT cancellation provided by both the floating conductive shield 202 on the body 201 and by a snap-on connector isolation shield at the IDC-end of the outlet 200, as described in more detail in U.S. Pat. No. 7,273,396. Referring back to FIGS. 3 and 4, the snap-on connector isolation shield is attached to (i.e., "snaps on") the IDC-end of the outlet 200 and is part of the alien crosstalk compensation stage 209. When included, the snap-on connector isolation shield functions in combination with the floating conductive shield 202 to reduce alien crosstalk levels in communications channels containing communications outlet 200. While the floating conductive shield 202 provides isolation to adjacent outlets 200 within a panel arrangement, a new challenge of unbalanced signal paths occurs caused, primarily, by the offset IDC arrangement of each outlet 200 and, secondarily, by the printed circuit board layout for a given pair P in relation to the floating conductive shield. By providing capacitive coupling compensation on the rigid printed circuit board to electrically balance out each differential pair P relative to the floating conductive shield 202, ANEXT is reduced with minimal resonant frequency spikes within the operating frequency range.

When combined, all these compensation stage subcomponents of the communications outlet 200 work together to enable the outlet to perform to the desired level to meet the cabling requirement standards for CAT6A.

Communications outlets 200 can be included in a variety of different types of electronic systems such as the communications network 100 of FIG. 1. The network 100 would typically include many communications channels 101, each channel interconnecting components such as the computer system 108 and network switch 122. Moreover, the computer system 108 and network switch 122 are just examples of components that can be connected to communications channels 101. A wide variety of electronic subsystems may be connected to respective communications channels 101 in lieu of the computer system 108 and switch 122. For example, the first electronic subsystem 108 could be a local area network (LAN) including a plurality of computers. Also, although the communication outlet 200 is discussed as being an RJ45 outlet in the present description, those skilled in the art will realize that the present invention may be utilized in other types of communications outlets as well, such as ARJ45 outlets, non-RJ type outlets like GG45 and TERA outlets, as well other communications outlets, whether or not associated with particular standards or proprietary formats.

A more detailed description of the various types of crosstalk discussed in the present application, namely internal, modal alien, and alien crosstalk, along with a more general discussion of crosstalk, is provided in the Ser. No. 12/234,597 application. One skilled in the art, however, will understand the meaning of these terms and thus they have not again been described in detail herein.

Note that although the term "rigid" is used to describe the circuit board 300 in the outlet 200 of FIGS. 3 and 3A, the use of this term is not intended to mean that the circuit board 300 has some additional rigidity beyond that of a conventional circuit board. Instead, the term is used merely to mean that the circuit board 300 must be sufficiently rigid to perform its desired function and that the circuit board 300 is "rigid" relative to the flexible printed circuit on which the internal crosstalk compensation stage 205 is formed in the embodiment of FIG. 3. Thus, the term "rigid" is used primarily to contrast the rigidity of the circuit board 300 relative to the rigidity of the flexible printed circuit board.

Even though various embodiments and advantages of the present invention have been set forth in the foregoing description, the above disclosure is illustrative only, and changes may be made in detail and yet remain within the broad principles of the present invention. Therefore, the present invention is to be limited only by the appended claims. Furthermore in the present description, certain details have been set forth in conjunction with the described embodiments of the present invention to provide a sufficient understanding of the invention. One skilled in the art will appreciate, however, that the invention itself and various aspects thereof may be practiced without these particular details. Furthermore, one skilled in the art will appreciate that the sample embodiments described do not limit the scope of the present invention and various modifications, equivalents and combinations of the disclosed embodiments and components of such embodiments are within the scope of the present invention. Embodiments including fewer than all the components of any of the respective described embodiments may also be within the scope of the present invention although not expressly described in detail herein. Finally, the operation or structure of well known components and/or processes has not been shown or described in detail herein to avoid unnecessarily obscuring the present invention.

What is claimed is:

1. A communications outlet, comprising:
   a plurality of electrically conductive paths arranged in pairs;
   an electrically conductive shield; and
   a plurality of conductive elements, each conductive element being connected to a corresponding conductive path and the conductive elements being configured, for each pair, to balance a capacitive coupling between the electrically conductive shield and the conductive paths of that pair.

2. The communications outlet of claim 1 wherein the electrically conductive shield comprises a floating electrically conductive shield.

3. The communications outlet of claim 1 further comprising:
   an insulating body; and
   wherein the electrically conductive shield is formed in or on the insulating body.

4. The communications outlet of claim 3 wherein the insulating body includes a surface and wherein the electrically conductive shield is formed on at least a portion of the surface.

5. The communications outlet of claim 4 wherein the surface is an outer surface of the insulating body.

6. The communications outlet of claim 1 further comprising:
   a rigid printed circuit board; and
   wherein the conductive elements correspond to conductive traces formed on the rigid printed circuit board.

7. The communications outlet of claim 1 further comprising:
   a rigid printed circuit board;
   wire termination contacts connected to the rigid printed circuit board; and
   wherein the wire termination contacts are positioned relative to the electrically conductive shield to form the conductive elements.

8. The communications outlet of claim 7 further comprising conductive traces formed on the rigid printed circuit board, these conductive traces and the wire termination contacts collectively forming the conductive elements that balance the capacitive coupling between the electrically conductive shield and the conductive paths of each pair.

9. The communications outlet of claim 8 wherein at least some of the wire termination contacts are insulation displacement connectors.

10. The communications outlet of claim 1 further comprising:
    a rigid printed circuit board; and
    wire termination contacts connected to the rigid printed circuit board, the conductive elements being attached to or formed as a part of the wire termination contacts.

11. The communications outlet of claim 1 wherein the communications outlet comprises one of an RJ45 outlet and an ARJ45 outlet.

12. A communications outlet, comprising:
    an insulating body having a surface;
    an electrically conductive shield formed on at least a portion of the surface of the insulating body;
    a plurality of wire termination contacts; and
    a rigid printed circuit board configured to be positioned within the insulating body, the rigid printed circuit board including a plurality of conductive traces and the wire termination contacts being attached to the rigid printed circuit board and electrically coupled to the conductive traces, the conductive traces on the rigid printed circuit board and the wire termination contacts being part of a plurality of electrically conductive paths of the communications outlet, with pairs of the electrically conductive paths being defined and the rigid printed circuit board including for each pair a capacitive coupling trace electrically connected to one of the electrically conductive paths of the pair, each capacitive coupling trace configured on the rigid printed circuit board to balance a capacitive coupling between the conductive shield and the electrically conductive paths of the associated pair.

13. The communications outlet of claim 12 wherein the electrically conductive shield comprises a floating electrically conductive shield that is not directly electrically connected to any circuit or ground connection.

14. The communications outlet of claim 12 wherein at least some of the wire termination contacts are insulation displacement connectors.

15. The communications outlet of claim 12 wherein the surface of the insulating body is an outer surface.

16. The communications outlet of claim 15 wherein the electrically conductive shield is formed over the entire outer surface of the insulating body.

17. The communications outlet of claim 12 wherein the outlet comprises one of an RJ45 outlet and an ARJ45 outlet.

18. The communications outlet of claim 12 further comprising a termination block configured to house the wire termination contacts and attach to the insulating body.

19. The communications outlet of claim 12 wherein the electrically conductive shield comprises a metallic shield.

20. The communications outlet of claim 12,
wherein each of the electrically conductive paths includes an electrically conductive tine, and
wherein the communications outlet further comprises a first internal crosstalk compensation stage formed on a flexible printed circuit board attached to at least some of the tines.

21. The communications outlet of claim 12 further comprising a first internal crosstalk compensation stage formed through crossovers of the tines of selected pairs of electrically conductive paths.

22. The communications outlet of claim 12,
wherein each of the electrically conductive paths includes an electrically conductive tine, and
wherein the communications outlet further comprises non-conductive and resilient spring arms connected to the rigid printed circuit board and positioned under the tines to provide mechanical support to the tines.

23. The communications outlet of claim 12 further comprising a first internal crosstalk compensation stage formed via conductive traces on the rigid printed circuit board.

24. The communications outlet of claim 12 further comprising an alien crosstalk compensation stage.

25. The communications outlet of claim 24 wherein the alien crosstalk compensation stage includes a modal alien crosstalk compensation stage formed on the rigid printed circuit board.

26. The communications outlet of claim 24,
wherein each of the electrically conductive paths includes an electrically conductive tine, and
wherein the alien crosstalk compensation stage includes a modal alien crosstalk compensation stage formed on a flexible printed circuit board attached to selected ones of the tines.

27. The communications outlet of claim 24,
wherein each of the electrically conductive paths includes an electrically conductive tine,
wherein the alien crosstalk compensation stage includes a first modal alien crosstalk compensation stage formed on a flexible printed circuit board attached to selected ones of the tines, and
wherein the alien crosstalk compensation stage includes a second modal alien crosstalk compensation stage formed on the rigid printed circuit board.

28. The communications outlet of claim 24 wherein the alien crosstalk compensation stage further includes a snap-on connector isolation shield structure attached to the end of the communications outlet where the wire termination contacts are located and operable to reduce alien crosstalk levels in communications channels containing the communications outlet.

29. The communications outlet of claim 12 wherein each of the electrically conductive paths includes an electrically conductive tine and wherein the communications outlet further comprises:
a first internal crosstalk compensation stage formed on a flexible printed circuit board attached to the tines;
a second internal crosstalk compensation stage formed through crossovers of the tines of selected pairs of electrically conductive paths;
a third internal crosstalk compensation stage formed on the rigid printed circuit board;
a modal alien crosstalk compensation stage; and
an alien crosstalk compensation stage including a snap-on connector isolation shield structure attached to the end of the communications outlet where the wire termination contacts are located and operable to reduce alien crosstalk levels in communications channels containing the communications outlet.

30. The communications outlet of claim 29 wherein the modal alien crosstalk compensation stage includes a first stage formed on the flexible printed circuit board.

31. The communications outlet of claim 30 wherein the modal alien crosstalk compensation stage includes a second stage formed on the rigid printed circuit board.

32. A method of reducing alien crosstalk in a communications outlet having a first electrically conductive shield and a plurality of electrically conductive paths arranged in pairs, the method comprising, for each pair, connecting a conductive element to at least one of the electrically conductive paths of the pair to balance a capacitive coupling between each of the electrically conductive paths of the pair and the first electrically conductive shield.

33. The method of claim 32 wherein a conductive element is added to only one of the electrically conductive paths in each pair.

34. The method of claim 32 wherein connecting a conductive element to at least one of the electrically conductive paths of the pair comprises forming capacitive coupling traces on a rigid printed circuit board.

35. The method of claim 32 further comprising reducing the internal crosstalk generated in the communications outlet.

36. The method of claim 35 further comprising reducing the modal alien crosstalk generation of the communications outlet.

37. The method of claim 36 further comprising providing a second electrically conductive shield structure positioned adjacent wire termination contacts of the communications outlet.

38. The method of claim 32 wherein the method further comprises electrically isolating the electrically conductive shield so there is no direct electrical connection between the electrically conductive shield and the electrically conductive paths and other circuitry in the communications outlet.

39. The method of claim 32 wherein each of the electrically conductive paths includes a tine and wherein the method further comprises providing from underneath the tines force to mechanically support the tines.

40. A communications outlet including an insulating body and a plurality of conductive paths, each conductive path including a corresponding outlet tine with the outlet tines being positioned adjacent one another, each outlet tine having a free end near which a plug contact is adapted to touch the outlet tine, and each outlet tine having a fixed end attached to a rigid printed circuit board and coupled through a corresponding conductive trace on the rigid printed circuit board to a corresponding wire termination contact, the communications outlet comprising:
an internal crosstalk compensation stage coupled to at least some of the conductive paths and operable to reduce internal crosstalk within the communications outlet;

a first modal alien crosstalk compensation stage connected to at least some of the conductive paths and operable to reduce modal alien crosstalk generated within the communications outlet; and
an alien crosstalk compensation stage, comprising:
an electrically conductive shield; and
a plurality of conductive elements, each conductive element being connected to a corresponding conductive path and the conductive elements being configured, for each signal pair, to balance a capacitive coupling between the electrically conductive shield and the conductive paths of that signal pair.

41. The communications outlet of claim 40 wherein the alien crosstalk compensation stage further comprises a snap-on connector isolation shield structure attached towards the end of the communications outlet where the wire termination contacts are located.

42. The communications outlet of claim 40 wherein the internal crosstalk compensation stage includes a first portion formed through crossover of the tines of selected pairs.

43. The communications outlet of claim 42 wherein the internal crosstalk compensation further includes a second portion formed on the rigid printed circuit board.

44. The communications outlet of claim 43 wherein the internal crosstalk compensation further includes a third portion formed on a flexible printed circuit board attached to selected ones of the tines.

45. The communications outlet of claim 40 wherein at least some of the wire termination contacts are insulation displacement connectors.

46. The communications outlet of claim 40 wherein the communications outlet further comprises an insulating body having an outer surface and wherein the electrically conductive shield is formed over the entire outer surface of the insulating body.

47. The communications outlet of claim 40 wherein the communications outlet comprises one of an RJ45 outlet and an ARJ45 outlet.

48. The communications outlet of claim 40 wherein the modal alien crosstalk compensation stage is formed on a flexible printed circuit board attached to the tines.

49. The communications outlet of claim 40 wherein the modal alien crosstalk compensation stage is formed on the rigid printed circuit board.

50. The communications outlet of claim 40 further comprising nonconductive and resilient spring arms connected to the rigid printed circuit board and positioned under the tines to provide mechanical support to the tines.

51. An electronic system, comprising:
a first electronic subsystem;
a first plurality of communications cables coupled to the first electronic subsystem, each cable including a corresponding communications plug;
a plurality of communications outlets, each communications outlet adapted to receive a corresponding one of the communications plugs, and at least some of the communications outlets comprising,
a plurality of electrically conductive paths arranged in pairs;
an electrically conductive shield; and
a plurality of conductive elements, each conductive element being connected to a corresponding conductive path and the conductive elements being configured, for each pair, to balance a capacitive coupling between the electrically conductive shield and the conductive paths of that pair;
a second plurality of communications cables coupled to the plurality of communications outlets; and
a second electronic subsystem coupled to the second plurality of communications cables.

52. The electronic system of claim 51 wherein the first and second electronic subsystems each comprise computer networks.

53. The electronic system of claim 51 wherein at least some of the communications outlets comprise one of an RJ45 outlet and an ARJ45 outlet.

54. The electronic system of claim 51 wherein the electrically conductive shield is floating relative to electrically conductive paths, conductive elements, and other electrical components in the electronic system.

55. The electronic system of claim 51 wherein each of the electrically conductive paths includes an electrically conductive tine and wherein at least some of the communications outlets further comprise:
a first internal crosstalk compensation stage formed on a flexible printed circuit board attached to the tines;
a second internal crosstalk compensation stage formed through crossovers of the tines of selected pairs of electrically conductive paths;
a third internal crosstalk compensation stage formed on the rigid printed circuit board;
a modal alien crosstalk compensation stage; and
an alien crosstalk compensation stage including a snap-on connector isolation shield structure attached to the end of the communications outlet where the wire termination contacts are located and operable to reduce alien crosstalk levels in communications channels containing the communications outlet.

* * * * *